United States Patent
Hashiguchi et al.

(10) Patent No.: US 10,541,486 B2
(45) Date of Patent: Jan. 21, 2020

(54) CONNECTOR ASSEMBLY AND CONNECTOR

(71) Applicant: JAPAN AVIATION ELECTRONICS INDUSTRY, LIMITED, Shibuya-ku, Tokyo (JP)

(72) Inventors: Osamu Hashiguchi, Tokyo (JP); Shigeharu Aoki, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/297,648

(22) Filed: Mar. 9, 2019

(65) Prior Publication Data

US 2019/0334267 A1 Oct. 31, 2019

(30) Foreign Application Priority Data

Apr. 27, 2018 (JP) ................... 2018-086427

(51) Int. Cl.
  *H01R 13/64* (2006.01)
  *H01R 12/73* (2011.01)
  *H01R 12/72* (2011.01)

(52) U.S. Cl.
  CPC ......... *H01R 12/73* (2013.01); *H01R 12/721* (2013.01)

(58) Field of Classification Search
  CPC ..................................... H01R 13/28
  USPC ...................... 439/248, 247, 374
  See application file for complete search history.

(56) References Cited

U.S. PATENT DOCUMENTS

| 6,439,909 B1 * | 8/2002 | Polgar | H01R 13/6315 439/247 |
| 6,739,893 B2 * | 5/2004 | Hallitschke | H05K 5/0069 439/248 |
| 7,347,715 B2 * | 3/2008 | Kobayashi | H01R 13/4538 439/248 |
| 7,628,629 B2 * | 12/2009 | Miyazaki | H01R 13/6315 439/248 |
| 9,048,601 B2 | 6/2015 | Kimura | |
| 9,270,045 B2 | 2/2016 | Kimura | |

FOREIGN PATENT DOCUMENTS

| JP | 2014146472 A | 8/2014 |
| JP | 2015035283 A | 2/2015 |

* cited by examiner

*Primary Examiner* — Phuong K Dinh
(74) *Attorney, Agent, or Firm* — Holtz, Holtz & Volek PC

(57) ABSTRACT

A connector assembly comprises a first connector and a second connector mateable with each other. The first connector comprises two first positioning portions each having a first outer surface, and the second connector comprises two second positioning portion each having a second outer surface. Under a mated state where the first connector and the second connector are mated with each other, the first outer surfaces face the second outer surfaces in a horizontal direction (Y-direction), respectively. The connector assembly comprises at least one of a pair of first depressions provided to the first positioning portions, respectively, and another pair of second depressions provided to the second positioning portions, respectively. For example, when the first positioning portions are provided with the first depressions, respectively, under the mated state, each of the first depressions is located below an upper end of the first outer surface and depressed inward in the horizontal direction.

13 Claims, 16 Drawing Sheets

CONNECTOR ASSEMBLY AND CONNECTOR

CROSS REFERENCE TO RELATED APPLICATIONS

This application is based on and claims priority under 35 U.S.C. § 119 to Japanese Patent Application No. JP2018-086427 filed Apr. 27, 2018, the content of which is incorporated herein in its entirety by reference.

BACKGROUND OF THE INVENTION

This invention relates to a connector assembly comprising two connectors mateable with each other.

For example, this type of connector assembly is disclosed in JP2014-146472A (Patent Document 1), the content of which is incorporated herein by reference.

Referring to FIG. 29, Patent Document 1 discloses a connector assembly 90 which comprises a receptacle (first connector) 92 and a plug (second connector) 94. The first connector 92 comprises a plurality of contacts 920 and a housing 930 which holds the contacts 920. The housing 930 is formed with two guide channels 932. The second connector 94 comprises a plurality of contacts 940 and a housing 950 which holds the contacts 940. The housing 950 has two guided portions 952. While the second connector 94 is mated with the first connector 92, the guided portions 952 are received into the guide channels 932, respectively, so that the second connector 94 is positioned to the first connector 92 in a horizontal direction (Y-direction).

Referring to FIG. 30, when an upward removal force FR directed in the positive Z-direction is applied to the second connector 94 which is under the mated state, the second connector 94 can be removed from the first connector 92. This removal force FR is preferred to be applied to the second connector 94 in a well-balanced manner in the Y-direction. However, the removal force FR is often biased toward one of opposite sides of the second connector 94 in the Y-direction. The thus-biased removal force FR generates an angular moment (see dashed line in FIG. 30) about a remaining one of the opposite sides of the second connector 94 in the Y-direction (the positive Y-side in FIG. 30), so that the second connector 94 is inclined relative to the first connector 92. When the inclination angle is large, the guided portion 952 (see FIG. 29), which is located at the remaining one of the opposite sides in the Y-direction, is strongly pressed against an outer wall 934 of the guide channel 932, so that the housing 930 and/or the housing 950 might be damaged.

SUMMARY OF THE INVENTION

It is therefore an object of the present invention to provide a connector assembly comprising a first connector and a second connector mateable with each other and having a structure which enables to reduce a damage that might be caused by an inclination of the second connector during a removal process of the second connector from the first connector.

An aspect of the present invention provides a connector assembly comprising a first connector and a second connector. The second connector is mateable with the first connector which is located below the second connector in an upper-lower direction. The first connector comprises two first positioning portions. The first positioning portions are apart from each other in a horizontal direction perpendicular to the upper-lower direction. Each of the first positioning portions projects upward and has a first inner surface facing inward in the horizontal direction and a first outer surface facing outward in the horizontal direction. The second connector comprises two second positioning portions which correspond to the first positioning portions, respectively. The second positioning portions are apart from each other in the horizontal direction. Each of the second positioning portions is recessed upward and has a second inner surface facing outward in the horizontal direction and a second outer surface facing inward in the horizontal direction. While the first connector and the second connector are mated with each other, the second positioning portions receive the first positioning portions, respectively, and the second connector is positioned to the first connector in the horizontal direction. Under a mated state where the first connector and the second connector are mated with each other, each of the first inner surfaces faces a corresponding one of the second inner surfaces in the horizontal direction, and each of the first outer surfaces faces a corresponding one of the second outer surfaces in the horizontal direction. The connector assembly comprises at least one of a pair of first depressions provided to the first positioning portions, respectively, and another pair of second depressions provided to the second positioning portions, respectively. When the first positioning portions are provided with the first depressions, respectively, each of the first depressions is formed on the first outer surface and, under the mated state, located below an upper end of the first outer surface and depressed inward in the horizontal direction. When the second positioning portions are provided with the second depressions, respectively, each of the second depressions is formed on the second inner surface and, under the mated state, located above a lower end of the second inner surface and depressed inward in the horizontal direction.

The connector according to an aspect of the present invention comprises the first connector and the second connector mateable with each other. Moreover, according to an aspect of the present invention, when the first positioning portions of the first connector have the first depressions, respectively, under the mated state, each of the first depressions is located below the upper end of the first outer surface and depressed inward in the horizontal direction. According to this structure, even if the second connector is inclined relative to the first connector during a removal process, one of the second outer surfaces of the second connector is received in the first depression of the corresponding one of the first outer surfaces so that no excessive force is applied to the second outer surface. Similarly, when the second positioning portions of the second connector have the second depressions, respectively, under the mated state, each of the second depressions is located above the lower end of the second inner surface and depressed inward in the horizontal direction. According to this structure, even if the second connector is inclined relative to the first connector during a removal process, one of the first inner surfaces of the first connector is received in the second depression of the corresponding one of the second inner surfaces so that no excessive force is applied to the second inner surface. Thus, the present invention provides a structure which enables to reduce a damage that might be caused by an inclination of the second connector during a removal process of the second connector from the first connector.

An appreciation of the objectives of the present invention and a more complete understanding of its structure may be had by studying the following description of the preferred embodiment and by referring to the accompanying drawings.

Figure 1:
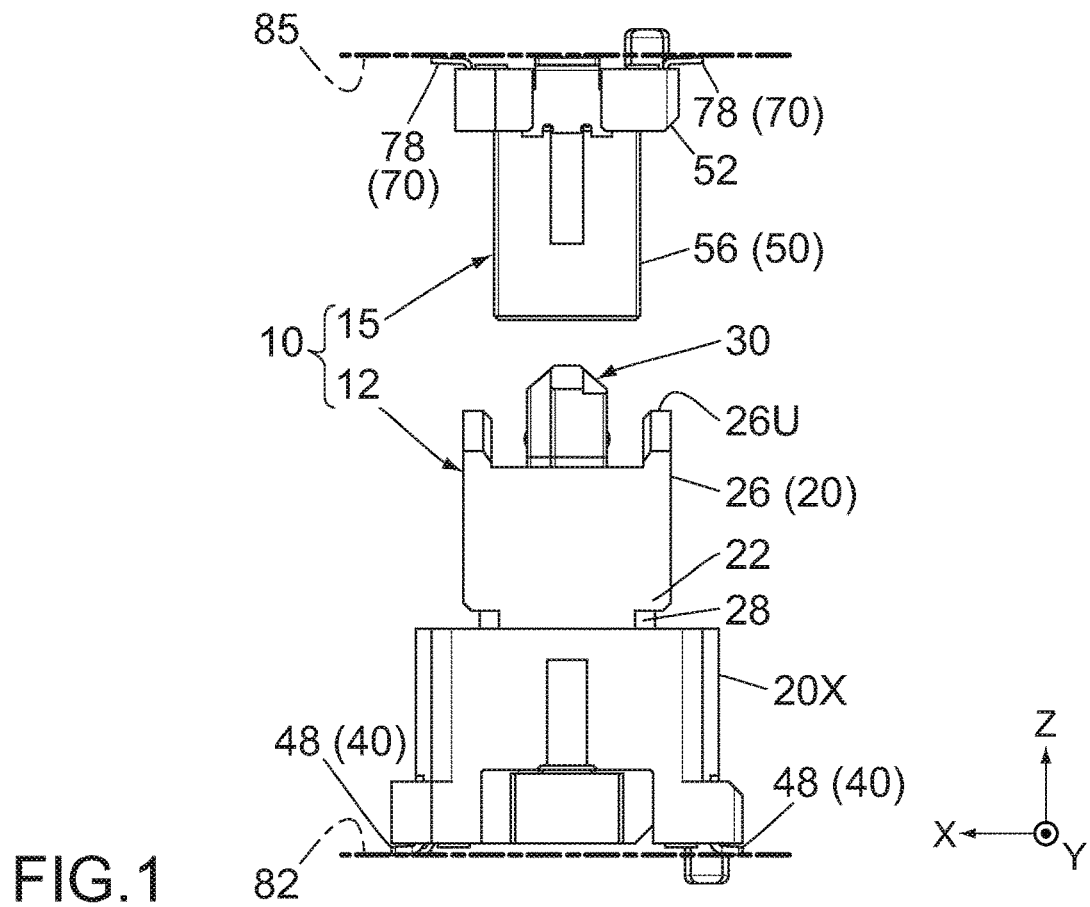
FIG. 1 is a side view showing a connector assembly according to an embodiment of the present invention, wherein a first connector and a second connector of the connector assembly are apart from each other, and a part of a first circuit board on which the first connector is mounted and a part of a second circuit board on which the second connector is mounted are illustrated in chain dotted line.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 2:
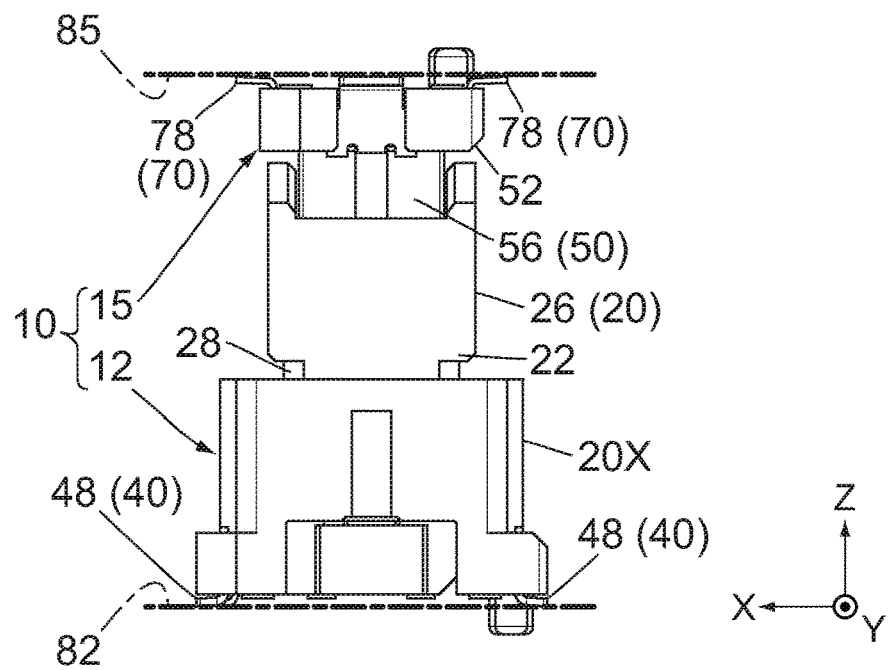
FIG. 2 is a side view showing the connector assembly of FIG. 1, wherein the first connector and the second connector are mated with each other.
Figure 3:
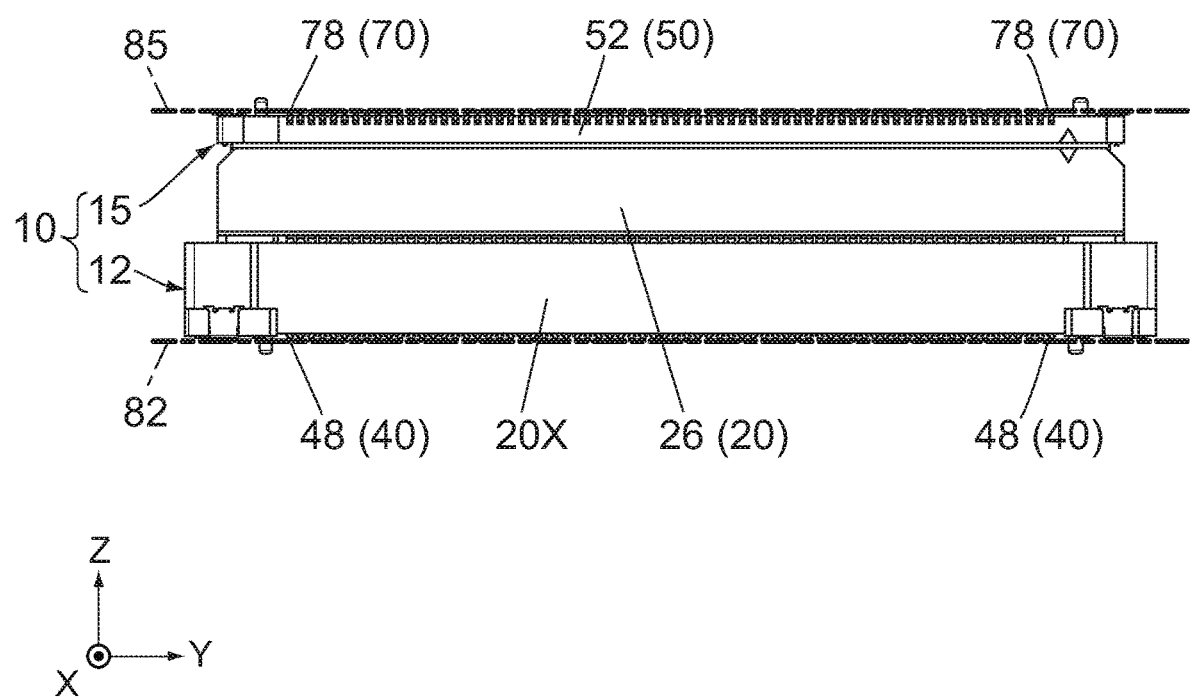
FIG. 3 is a front view showing the connector assembly of FIG. 2.

As shown in FIGS. 1 to 3, a connector assembly 10 according to an embodiment of the present invention comprises a first connector 12 and a second connector 15. The second connector 15 is mateable with the first connector 12 which is located below the second connector 15 in an upper-lower direction (Z-direction), or located toward the negative Z-side of the second connector 15, along the Z-direction. The second connector 15 which is mated with the first connector 12 is removable from the first connector 12 along the Z-direction.

In the present embodiment, the first connector 12 is an on-board connector that is to be mounted on a first circuit board 82, and the second connector 15 is another on-board connector that is to be mounted on a second circuit board 85. The first connector 12 is a plug, and the second connector 15 is a receptacle. However, the present invention is not limited thereto but applicable to a connector assembly comprising one of various types of first connectors and one of various types of second connectors. For example, the first connector 12 may be a receptacle, and the second connector 15 may be a plug.

Hereafter, explanation will be made about a basic structure of the connector assembly 10 of the present embodiment which is common to a connector assembly 10A and a connector assembly 10B according to modifications described later.

Referring to FIGS. 4 to 7, the first connector 12 comprises a first holding member (movable housing) 20 made of insulator, a fixed housing 20X made of insulator and a plurality of first terminals 40 each made of conductor. The first holding member 20 is arranged above the fixed housing 20X, or toward the positive Z-side of the fixed housing 20X, as a whole. The first holding member 20 is supported by the fixed housing 20X and is movable to some extent relative to the fixed housing 20X in a horizontal plane (XY-plane) perpendicular to the Z-direction. The first terminals 40 are held by the first holding member 20 and arranged in a horizontal direction (Y-direction: pitch direction) perpendicular to the Z-direction. In detail, the first terminals 40 are separated into two rows in a front-rear direction (X-direction) perpendicular to both the Y-direction and the Z-direction. The first terminals 40 in each row are arranged along the Y-direction at regular intervals.

The first holding member 20 has a middle wall 22, an island-like portion 24, a first peripheral wall 26 and legs 28. The middle wall 22 is located at the middle of the first holding member 20 in the Z-direction and extends in parallel to the XY-plane. The island-like portion 24 is located at the middle of the middle wall 22 in the XY-plane and extends long along the Y-direction. The first peripheral wall 26 extends upward along the Z-direction, or in the positive Z-direction, from the edge of the middle wall 22 in the XY-plane. The first peripheral wall 26 has two end walls 262 which are located at opposite ends of the first peripheral wall 26 in the Y-direction, respectively. The island-like portion 24 extends upward from the middle wall 22 and projects beyond the first peripheral wall 26. The legs 28 extend downward from opposite ends of the middle wall 22 in the Y-direction, respectively.

Figure 7:
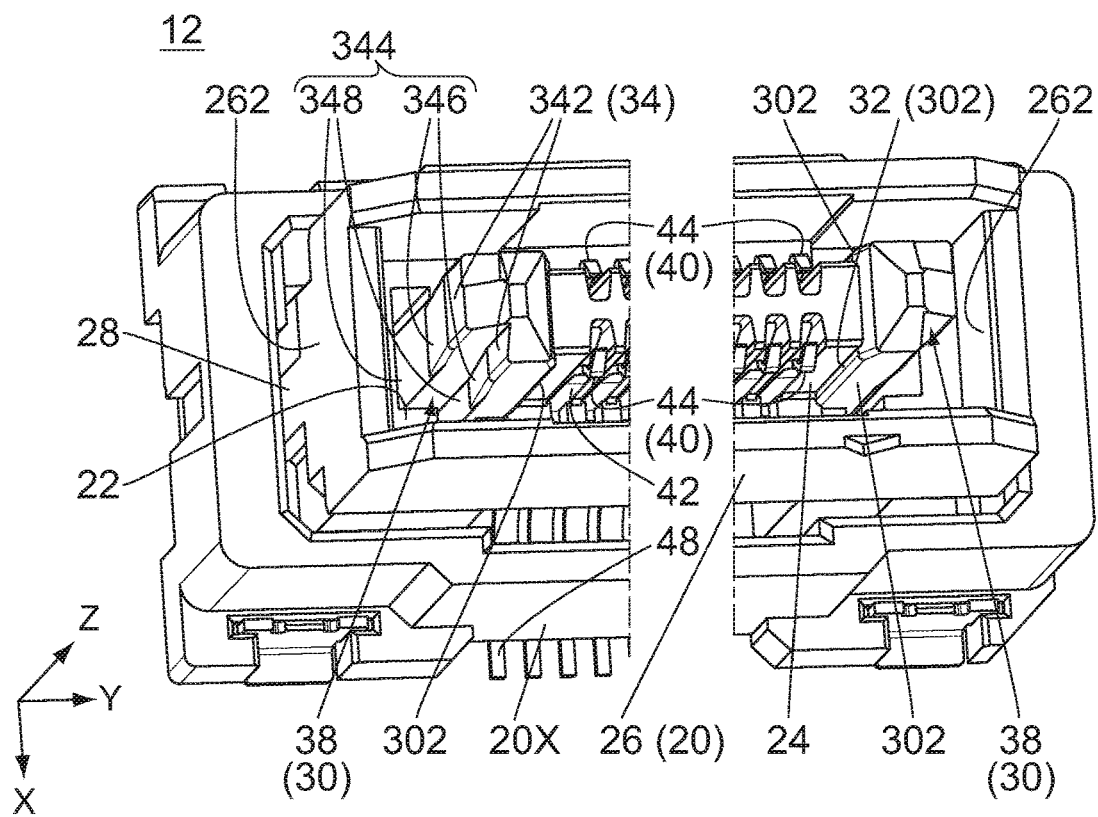
FIG. 7 is a perspective view showing opposite sides of the first connector of FIG. 4 in a horizontal direction.

Referring to FIG. 7, the first terminals 40 have shapes same as one another and sizes same as one another. In detail, each of the first terminals 40 is a single metal plate with bends and has a first spring portion 42, a first contact portion 44 and a first fixed portion 48. The first spring portion 42 extends along the island-like portion 24 and is resiliently deformable. The first contact portion 44 is supported by the first spring portion 42 and is movable in the X-direction. Referring to FIG. 1, when the first connector 12 is used, the first fixed portion 48 is fixed and connected to a conductive pad (not shown) of the first circuit board 82 via soldering, etc.

Referring to FIGS. 4 to 7, as described above, the first connector 12 comprises the two rows of the first terminals 40 each of which is arranged in the Y-direction. The two rows of the first terminals 40 are mirror-symmetrically arranged with respect to the YZ-plane across the island-like portion 24. Each of the first terminals 40 of one of the rows extends upward to the vicinity of an upper end 24U (positive Z-side end) of the island-like portion 24 along a front surface (positive X-side surface) of the island-like portion 24. Each of the first terminals 40 of a remaining one of the rows extends upward to the vicinity of the upper end 24U of the island-like portion 24 along a rear surface (negative X-side surface) of the island-like portion 24. A distance between two of the first terminals 40 adjacent to each other in the Y-direction is almost same as a size of the first terminal 40 in the Y-direction. Thus, the first terminals 40 in each row are arranged with narrow pitch in the Y-direction.

Referring to FIGS. 8 to 11, the second connector 15 comprises a second holding member 50 made of insulator and a plurality of second terminals 70 each made of conductor. The second terminals 70 are held by the second holding member 50 and arranged in the Y-direction so as to correspond to the first terminals 40 (see FIG. 7) of the first connector 12 (see FIG. 4), respectively. In detail, the second terminals 70 are separated into two rows in the X-direction. The second terminals 70 in each row are arranged at regular intervals along the Y-direction.

The second holding member 50 has a base portion 52, a receiving portion 54 and a second peripheral wall 56. The base portion 52 is located at an upper end of the second holding member 50 and extends in parallel to the XY-plane. The receiving portion 54 is a space which is located at the middle of the base portion 52 in the XY-plane. The receiving portion 54 extends long along the Y-direction and opens downward. The second peripheral wall 56 extends downward along the Z-direction from the edge of the base portion 52 in the XY-plane. The second peripheral wall 56 encloses the receiving portion 54 in the XY-plane. The second peripheral wall 56 has two end walls 562 which are located at opposite ends of the second peripheral wall 56 in the Y-direction, respectively.

Figure 11:
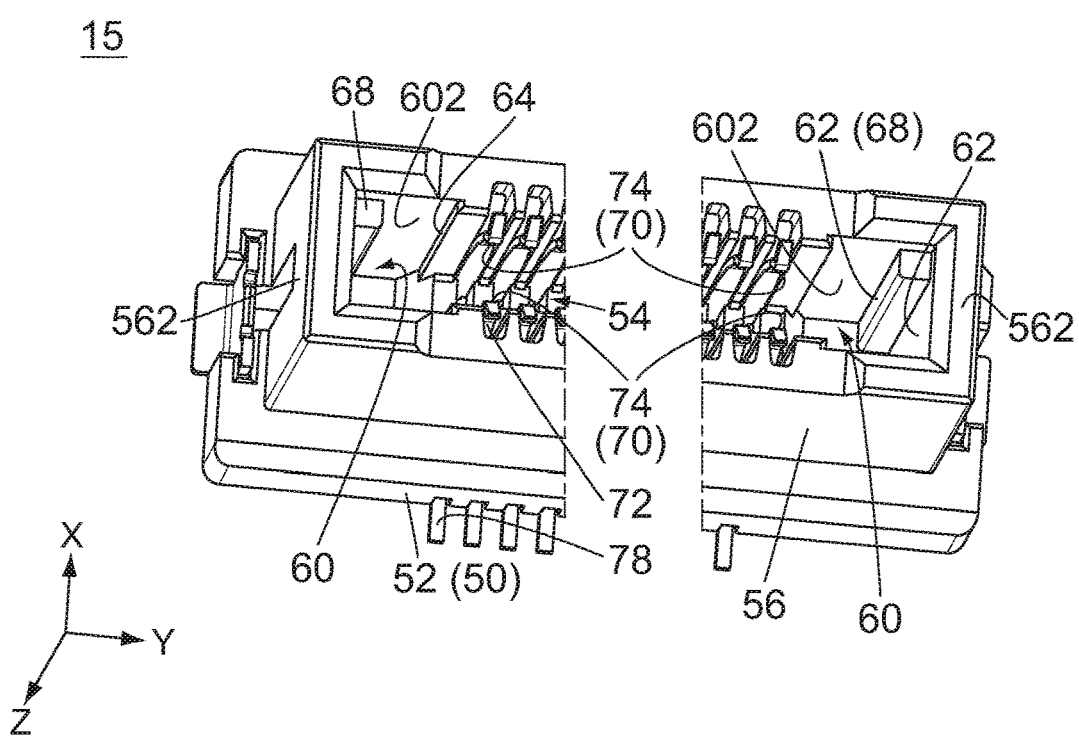
FIG. 11 is a perspective view showing opposite sides of the second connector of FIG. 8 in the horizontal direction.

Referring to FIG. 11, the second terminals 70 have shapes same as each other and sizes same as each other. In detail, each of the second terminals 70 is a single metal plate with bends and has a second spring portion 72, a second contact portion 74 and a second fixed portion 78. The second spring portion 72 extends along an inner wall surface of the second peripheral wall 56 and is resiliently deformable. The second contact portion 74 is supported by the second spring portion 72 and is movable in the X-direction. Referring to FIG. 1, when the second connector 15 is used, the second fixed portion 78 is fixed and connected to a conductive pad (not shown) of the second circuit board 85 via soldering, etc.

Referring to FIGS. 8 to 11, as described above, the second connector 15 comprises the two rows of the second terminals 70 each of which is arranged in the Y-direction. The two rows of the second terminals 70 are mirror-symmetrically arranged with respect to the YZ-plane across the receiving portion 54. Each of the second terminals 70 of one of the rows extends downward to the vicinity of a lower end (negative Z-side end) of the second peripheral wall 56 along the inner wall surface of a front wall (positive X-side wall) of the second peripheral wall 56. Each of the second terminals 70 of a remaining one of the rows extends downward to the vicinity of the lower end of the second peripheral wall 56 along the inner wall surface of a rear wall (negative X-side wall) of the second peripheral wall 56. A distance between two of the second terminals 70 adjacent to each other in the Y-direction is almost same as a size of the second terminal 70 in the Y-direction. Thus, the second terminals 70 in each row are arranged with narrow pitch in the Y-direction similarly to the first terminals 40 (see FIG. 4).

Referring to FIGS. 7 and 11, the island-like portion 24 and the first peripheral wall 26 of the first connector 12 correspond to the receiving portion 54 and the second peripheral wall 56 of the second connector 15. In addition, the first terminals 40 correspond to the second terminals 70, respectively. More specifically, under a mated state where the first connector 12 and the second connector 15 are mated with each other, the receiving portion 54 receives the island-like portion 24 together with the first contact portions 44 of the first terminals 40, and the apace between the island-like portion 24 and the first peripheral wall 26 receives the second peripheral wall 56. Moreover, under the mated state, each of the first terminals 40 is brought into contact with the corresponding second terminal 70 at the first contact portion 44 and the second contact portion 74. As a result, the first circuit board 82 (see FIG. 3) is electrically connected with the second circuit board 85 (see FIG. 3).

In the present embodiment, each of the first connector 12 and the second connector 15 has the aforementioned structure. In particular, the first connector 12 of the present embodiment is a floating connector. However, the present invention is not limited thereto. For example, the first connector 12 does not need to be a floating connector. Each of the first connector 12 and the second connector 15 may further comprise various members in addition to the aforementioned members. Moreover, the structure of each of the first holding member 20, the first terminals 40, the second holding member 50 and the second terminals 70 can be variously modified, provided that the first connector 12 and the second connector 15 are mateable with each other.

The connector assembly 10 which is formed as described above has a positioning mechanism that positions the second connector 15 to the first connector 12. While the second connector 15 is mated with the first connector 12, the second connector 15 is positioned in the XY-plane, particularly in the Y-direction, by the positioning mechanism of the connector assembly 10. As a result, the first terminals 40 are accurately brought into contact with the second terminals 70, respectively, although the first terminals 40 are arranged with narrow pitch, and the second terminals 70 are arranged with narrow pitch. Hereafter, explanation will be made about the positioning mechanism of the connector assembly 10.

Referring to FIGS. 4 to 7, the first connector 12 comprises two first positioning portions 30. The first positioning portions 30 are apart from each other in the Y-direction. Each of the first positioning portions 30 projects upward from the middle wall 22. In other words, each of the first positioning portions 30 is a projecting portion that projects upward. Each of the first positioning portions 30 has a front part, or the positive X-side part, which is partially recessed rearward, or in the negative X-direction, so that a first key 38 is formed. Thus, each of the first positioning portions 30 has the first key 38. Each of the first keys 38 is a rectangular column-like space which opens upward and is located at an intersecting corner of a front side (positive X-side) and an outer side in the Y-direction of the first positioning portion 30.

Each of the first positioning portions 30 has a first inner surface 32 facing inward in the Y-direction and a first outer surface 34 facing outward in the Y-direction. The first inner surface 32 and the first outer surface 34 are located at opposite sides of the first positioning portion 30 in the Y-direction. Each of the first inner surfaces 32 is a perpendicular plane perpendicular to the Y-direction. Each of the first outer surfaces 34 has an upper end portion, namely a first outer plane 342. Each of the first outer planes 342 is a perpendicular plane perpendicular to the Y-direction.

Referring to FIGS. 8 to 11, the second connector 15 comprises two second positioning portions 60 which correspond to the first positioning portions 30 (see FIG. 5), respectively. The second positioning portions 60 are apart from each other in the Y-direction. Each of the second positioning portions 60 is recessed upward to the base portion 52. In other words, each of the second positioning portions 60 is a recess which opens downward. Each of the second positioning portions 60 has a front part which is formed with a second key 68. Thus, each of the second positioning portions 60 has the second key 68. Each of the second keys 68 is a rectangular column-like pillar which extends downward from the base portion 52 and is located at a front side corner of the inner wall surface of the second peripheral wall 56.

Figure 9:
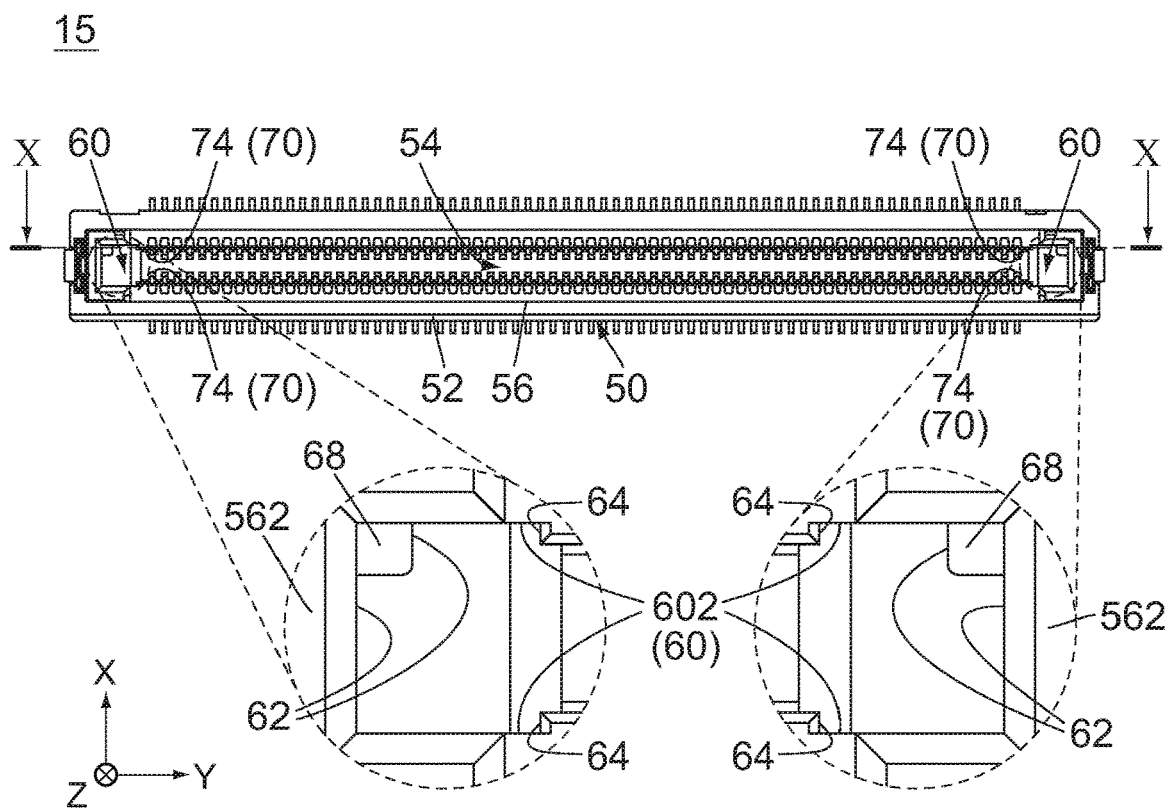
FIG. 9 is a plane view showing the second connector of FIG. 8, wherein parts of the second connector enclosed by dashed line are enlarged to be illustrated.
Figure 10:
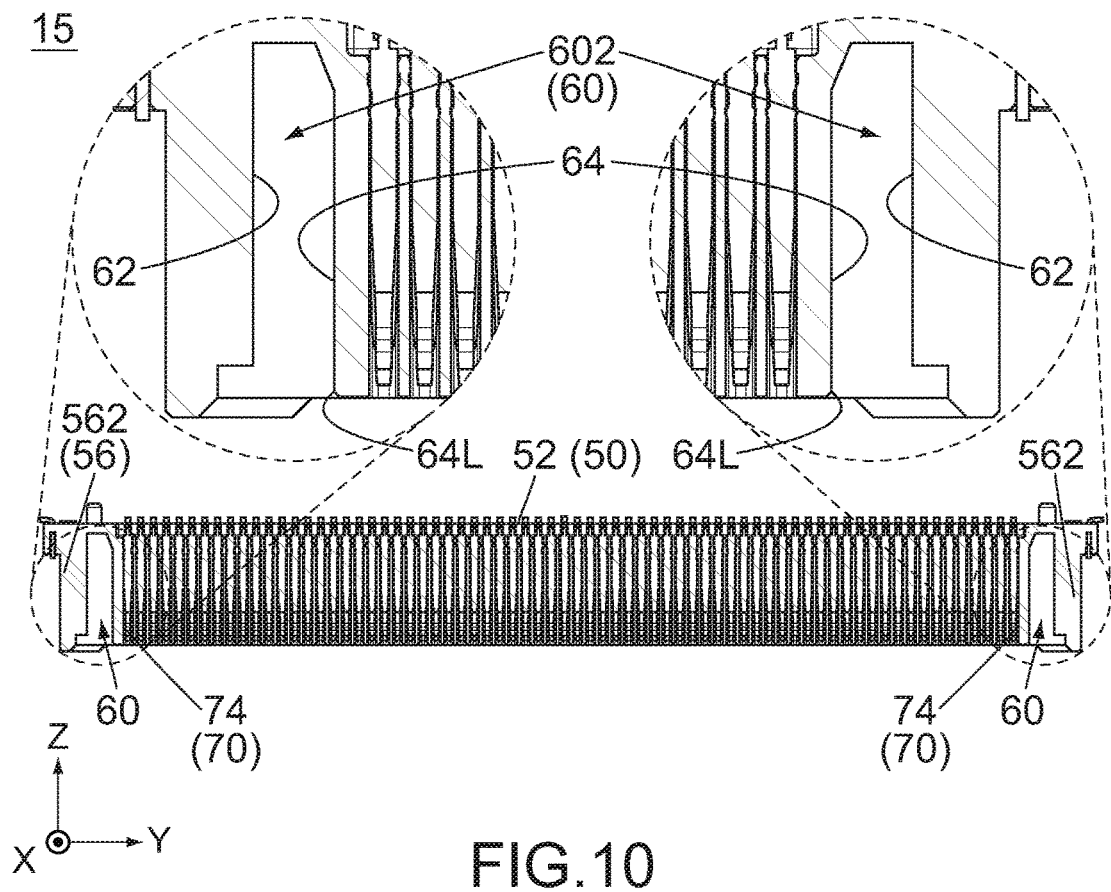
FIG. 10 is a cross-sectional view showing the second connector of FIG. 9, taken along line X-X, wherein parts of the second connector enclosed by dashed line are enlarged to be illustrated.

Referring to FIGS. 9 to 11, each of the second positioning portions 60 has a second inner surface 64 facing outward in the Y-direction and a second outer surface 62 facing inward in the Y-direction. The second inner surface 64 and the second outer surface 62 are located at opposite sides of the second positioning portion 60 in the Y-direction, respectively. Each of the second inner surfaces 64 and the second outer surfaces 62 is a perpendicular plane perpendicular to the Y-direction.

Referring to FIGS. 7 and 11, each of the first positioning portions 30 and the second positioning portions 60 according to the present embodiment has the aforementioned structure. The structures of the second positioning portions 60 correspond to the structures of the first positioning portions 30, respectively. The two first positioning portions 30 are mirror-symmetrically arranged with respect to the XZ-plane, and the two second positioning portions 60 are mirror-symmetrically arranged with respect to the XZ-plane. However, the present invention is not limited thereto, but the structure of each of the first positioning portions 30 and the second positioning portions 60 can be variously modified.

Figure 12:
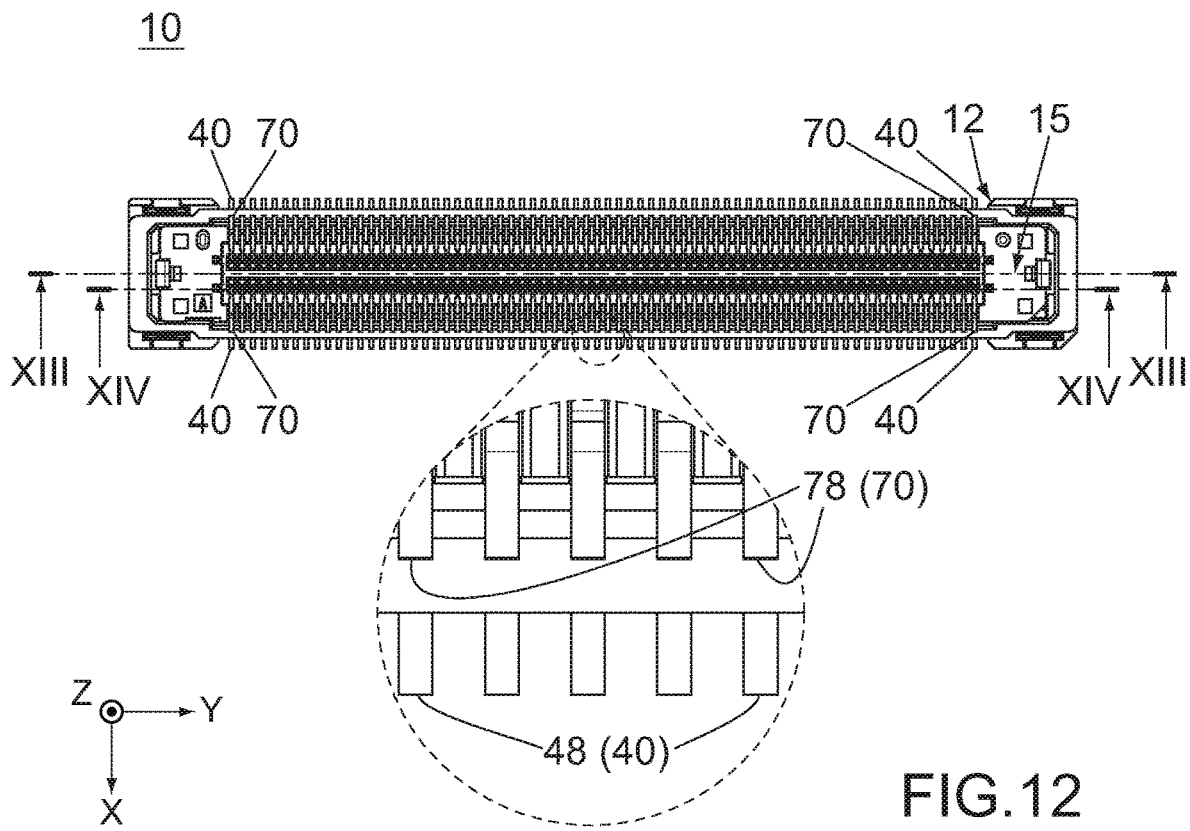
FIG. 12 is a plane view showing the connector assembly of FIG. 3, wherein a part of the connector assembly enclosed by dashed line is enlarged to be illustrated.
Figure 13:
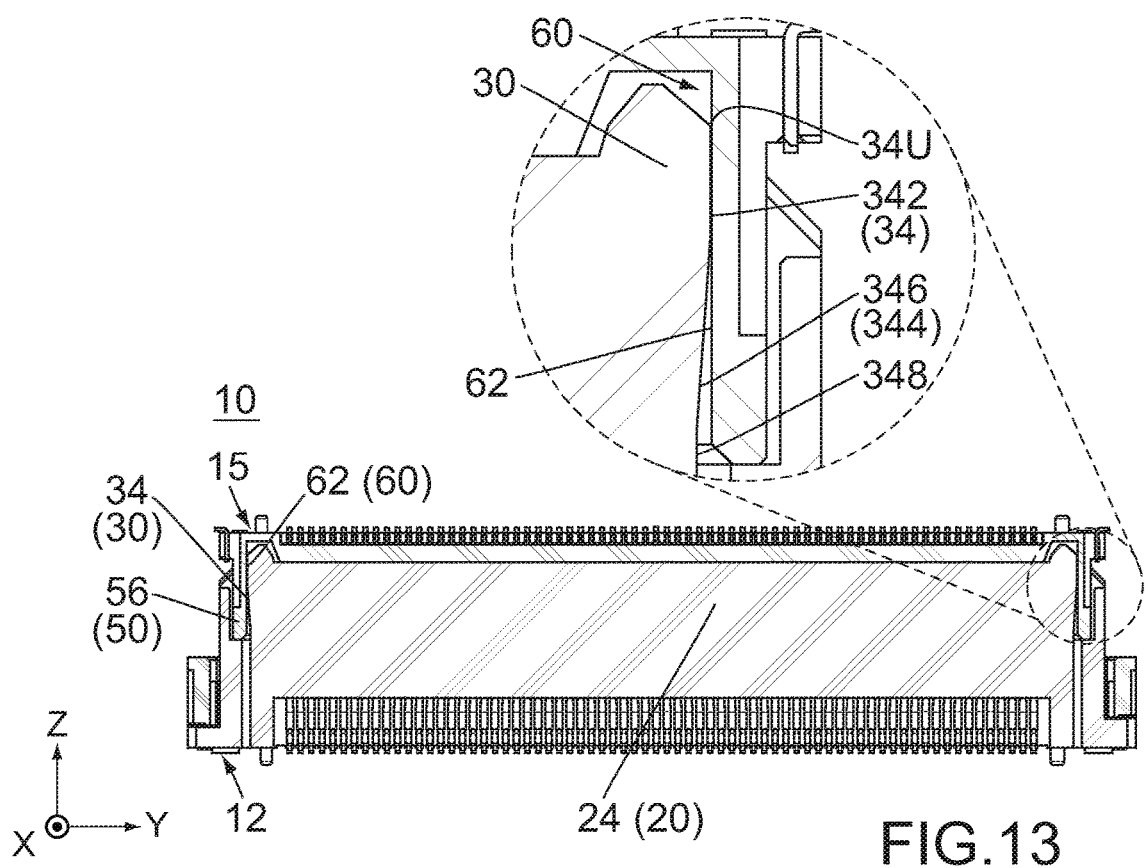
FIG. 13 is a cross-sectional view showing the connector assembly of FIG. 12, taken along line XIII-XIII, wherein a part of the connector assembly enclosed by dashed line is enlarged to be illustrated.
Figure 14:
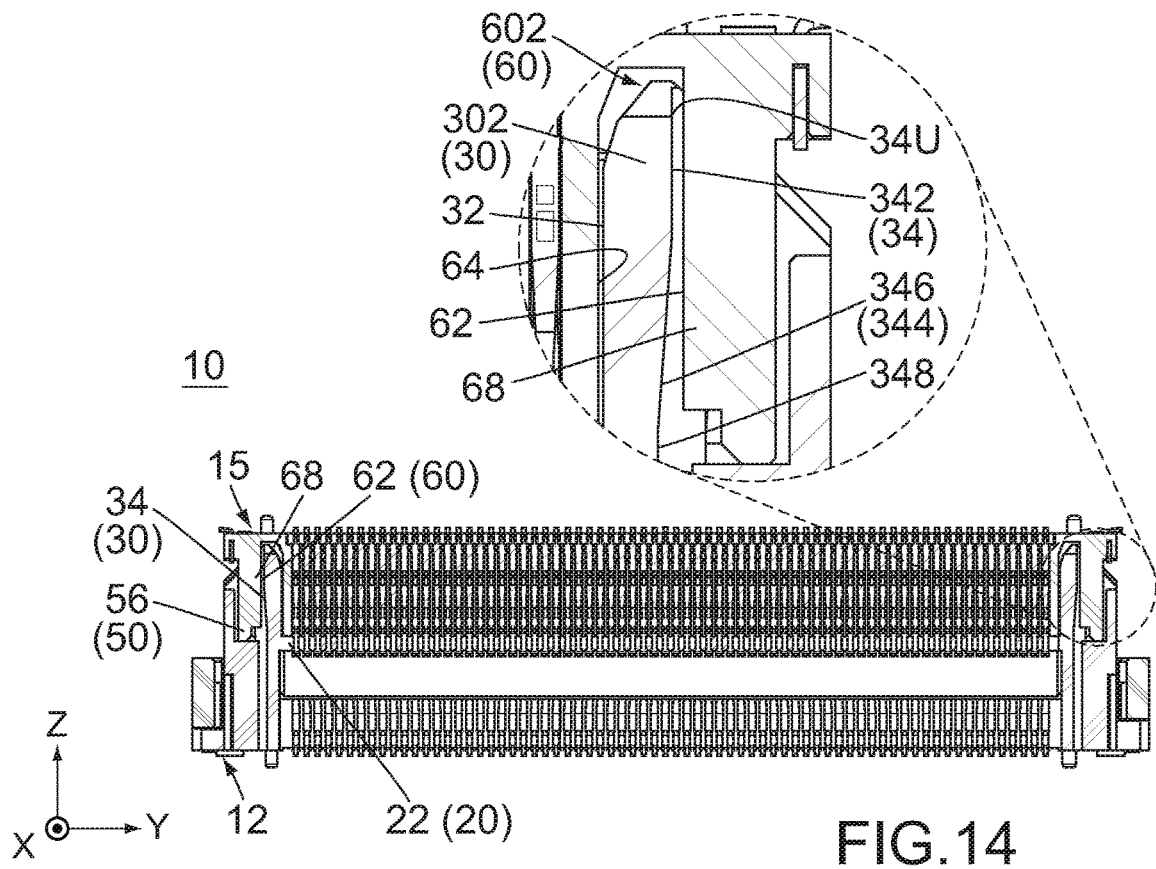
FIG. 14 is a cross-sectional view showing the connector assembly of FIG. 12, taken along line XIV-XIV, wherein a part of the connector assembly enclosed by dashed line is enlarged to be illustrated.

Referring to FIGS. 13 and 14, while the first connector 12 and the second connector 15 are mated with each other, the second positioning portions 60 receive the first positioning portions 30, respectively, so that the second connector 15 is positioned to the first connector 12 in the XY-plane, particularly in the Y-direction. In a mating process in which the first connector 12 and the second connector 15 are mated with each other, each of the first inner surfaces 32 becomes close to and faces the corresponding second inner surface 64 in the Y-direction, and each of the first outer planes 342 of the first outer surfaces 34 becomes close to and faces the corresponding second outer surface 62 in the Y-direction. As a result, as can be seen from FIG. 12, each of the first terminals 40 is brought into contact with the corresponding second terminal 70 with almost no misalignment in the Y-direction. The positioning mechanism of the connector assembly 10 is formed of the first positioning portions 30 and the second positioning portions 60 which work as described above.

Figure 6:
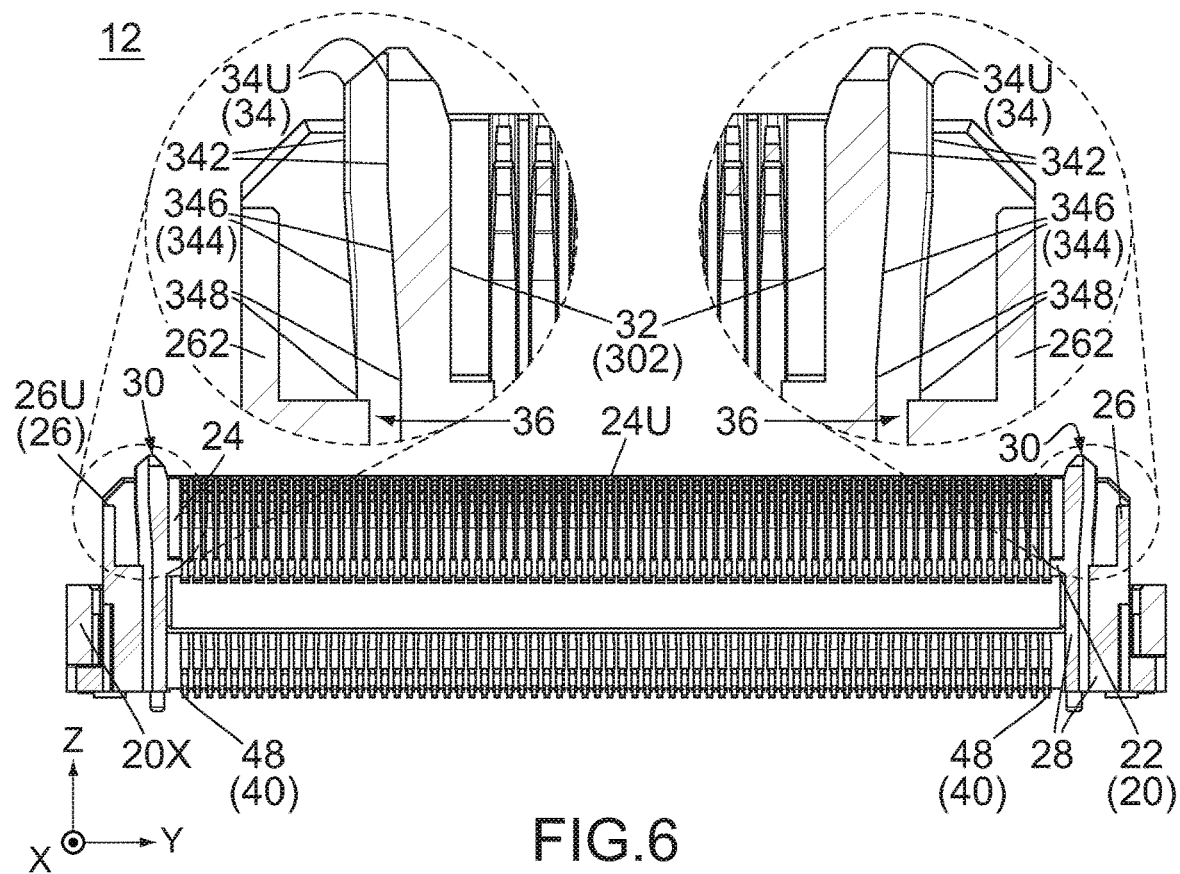
FIG. 6 is a cross-sectional view showing the first connector of FIG. 5, taken along line VI-VI, wherein parts of the first connector enclosed by dashed line are enlarged to be illustrated.

Referring to FIGS. 1 and 6, in the present embodiment, each of the first positioning portions 30 projects upward beyond an upper end 26U of the first peripheral wall 26 and the upper end 24U of the island-like portion 24. Therefore, while the first connector 12 and the second connector 15 are mated with each other, the first positioning portions 30 are first received into the second positioning portions 60 (see FIG. 10), respectively, so that the second connector 15 is positioned. However, the present invention is not limited thereto. For example, the positioning mechanism of the connector assembly 10 may have the other positioning portions in addition to the first positioning portions 30 and the second positioning portions 60.

Referring to FIGS. 4 to 7, the first positioning portions 30 are located at opposite sides of the island-like portion 24 in the Y-direction, respectively. In detail, for each of the first positioning portions 30, the first inner surface 32 is located at an end of the island-like portion 24 in the Y-direction, and the first outer surface 34 is located in the vicinity of the end wall 262 of the first peripheral wall 26 in the Y-direction. Referring to FIGS. 8 to 11, the second positioning portions 60 are located at opposite sides of the second peripheral wall 56 in the Y-direction, respectively. In detail, referring to FIGS. 9 to 11, for each of the second positioning portions 60, the second inner surface 64 is located at an end of the receiving portion 54 in the Y-direction, and the second outer surface 62 is provided on the end wall 562 of the second peripheral wall 56.

Figure 5:
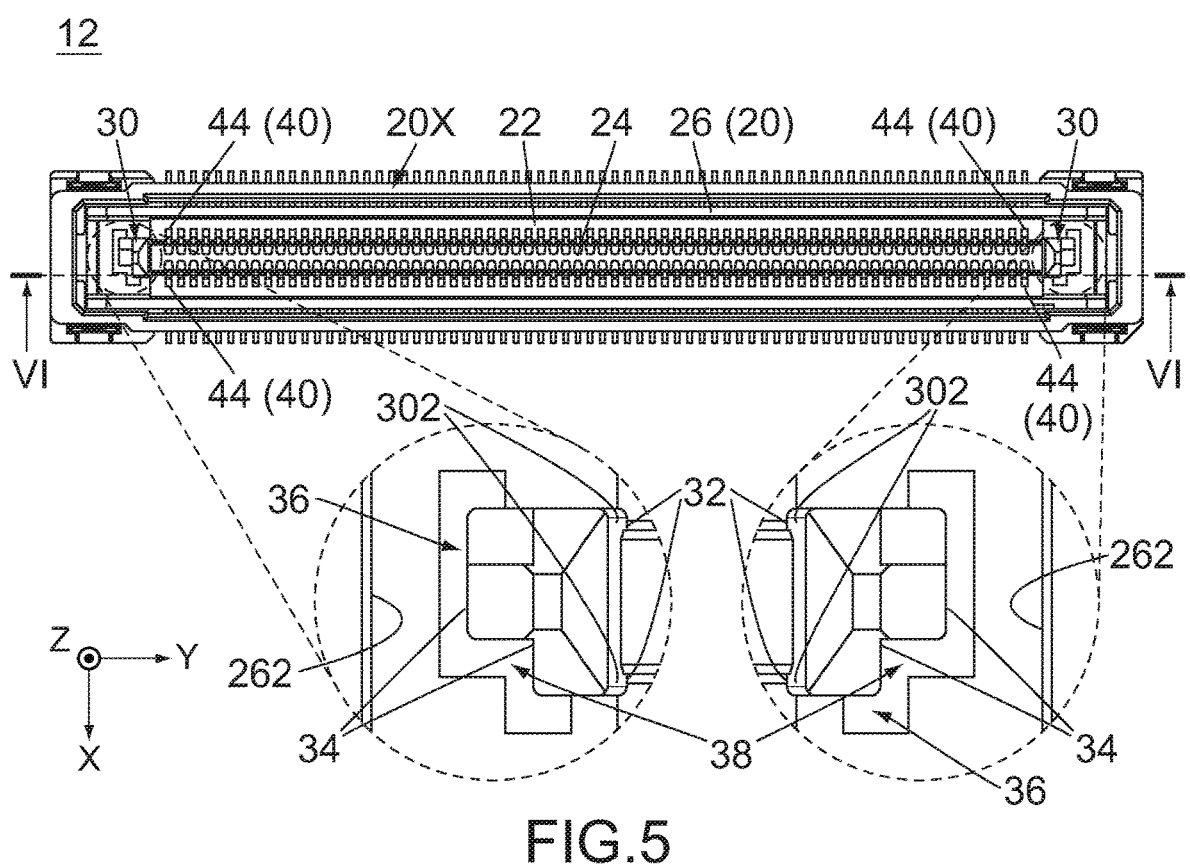
FIG. 5 is a plane view showing the first connector of FIG. 4, wherein parts of the first connector enclosed by dashed line are enlarged to be illustrated.

Referring to FIGS. 5 and 9, as described above, the present embodiment has a feature that the first positioning portions 30 are located in the vicinities of opposite ends of the first connector 12 in the Y-direction, respectively, and the second positioning portions 60 are located in the vicinities of opposite ends of the second connector 15 in the Y-direction, respectively. In other words, a positioning distance, or each of a distance between the two first positioning portions 30 in the Y-direction and another distance between the two second positioning portions 60 in the Y-direction, is designed to be as long as possible. In addition, in the present embodiment, the first terminals 40 are arranged in the Y-direction, and the second terminals 70 are arranged in the Y-direction. Thus, the pitch direction along which the first terminals 40 and the second terminals 70 are arranged is equal to the horizontal direction along which the two first positioning portions 30 and the two second positioning portions 60 are arranged.

According to the aforementioned structure, each of the first terminals 40 can be accurately positioned to the corresponding second terminal 70 in the Y-direction regardless of some tolerances. However, the present invention is not limited thereto. For example, the two first positioning portions 30 may be located at opposite sides of the first holding member 20 in the X-direction, and the two second positioning portions 60 may be located at opposite sides of the second holding member 50 in the X-direction. In other words, the horizontal direction may be the front-rear direction (X-direction) perpendicular to the pitch direction (Y-direction).

Referring to FIGS. 7 and 11, in the present embodiment, while the first connector 12 and the second connector 15 are mated with each other, the second keys 68 of the second positioning portions 60 are received into the first keys 38 of the first positioning portions 30, respectively. Thus, the first keys 38 and the second keys 68 work as mating keys. However, the present invention is not limited thereto. For example, the first keys 38 and the second keys 68 may be provided as necessary. Moreover, the first keys 38 and the second keys 68 may be variously shaped and arranged as necessary.

Referring to FIGS. 5 to 7, in the present embodiment, the first positioning portions 30 are connected to the opposite ends of the island-like portion 24 in the Y-direction, respectively. In other words, the island-like portion 24 and the first positioning portions 30 form a single continuous structure. In the XY-plane, the first peripheral wall 26 is apart from the island-like portion 24 and the first positioning portions 30 and encloses the island-like portion 24 and the first positioning portions 30. Referring to FIGS. 9 and 11, in the present embodiment, the second positioning portions 60 are connected to the opposite ends of the receiving portion 54 in the Y-direction, respectively. In other words, the receiving portion 54 and the second positioning portions 60 form a single continuous space. However, the present invention is not limited thereto. For example, referring to FIGS. 7 and 11, the first positioning portions 30 may be apart from the opposite ends of the island-like portion 24 in the Y-direction to some extent, respectively. In this case, a partition wall may be provided between each of the second positioning portions 60 and the receiving portion 54.

Referring to FIGS. 5 and 7, in the present embodiment, each of the first positioning portions 30 protrudes outward in the X-direction beyond the island-like portion 24. Thus, each of the first positioning portions 30 has two protruding portions 302 each of which protrudes outward in the X-direction beyond the island-like portion 24. In each of the first positioning portions 30, the first inner surface 32 includes inner surfaces of the two protruding portions 302 in the Y-direction. However, the present invention is not limited thereto. For example, in a case where the first positioning portions 30 are apart from the opposite ends of the island-like portion 24 in the Y-direction, respectively, each of the first inner surfaces 32 may be a surface which faces the island-like portion 24 in the Y-direction.

In the present embodiment, each of the second positioning portions 60 has two recessed portions 602 each of which is recessed outward in the X-direction. Each of the recessed portions 602 is formed so that the inner wall surface of the second peripheral wall 56 facing inward in the X-direction is recessed outward in the X-direction. In each of the second positioning portions 60, the second inner surface 64 includes surfaces of the two recessed portions 602 which face outward in the Y-direction. However, the present invention is not limited thereto. For example, in a case where the partition wall is provided between each of the second positioning portions 60 and the receiving portion 54, the second inner surface 64 may be an outer surface of the partition wall in the Y-direction.

Referring to FIGS. 7, 11 and 14, the present embodiment has a feature that the recessed portions 602 of the second positioning portions 60 receive the protruding portions 302 of the first positioning portions 30, respectively, under the mated state. However, the present invention is not limited thereto, but the recessed portions 602 and the protruding portions 302 may be provided as necessary.

Referring to FIGS. 5 and 7, the present embodiment has a feature that each of the first positioning portions 30 is formed with the first key 38, so that the first outer surface 34 includes two surfaces, namely two facing surfaces, which face the first peripheral wall 26 in the Y-direction. The two facing surfaces of each of the first outer surfaces 34 are apart from each other in the Y-direction. However, the present invention is not limited thereto. For example, in a case where the first keys 38 are not formed, each of the first outer surfaces 34 may be a single surface which faces the first peripheral wall 26 in the Y-direction.

Referring to FIGS. 9 and 11, the present embodiment has a feature that each of the second positioning portions 60 is formed with the second key 68, so that the second outer surface 62 includes two surfaces which face inward in the Y-direction. In detail, each of the second outer surfaces 62 includes an inner wall surface of the second peripheral wall 56 which faces inward in the Y-direction and a surface of the second key 68 which faces inward in the Y-direction. However, the present invention is not limited thereto. For example, in a case where the second keys 68 are not formed, each of the second outer surfaces 62 may be only the inner wall surface of the second peripheral wall 56 which faces inward in the Y-direction.

Figure 4:
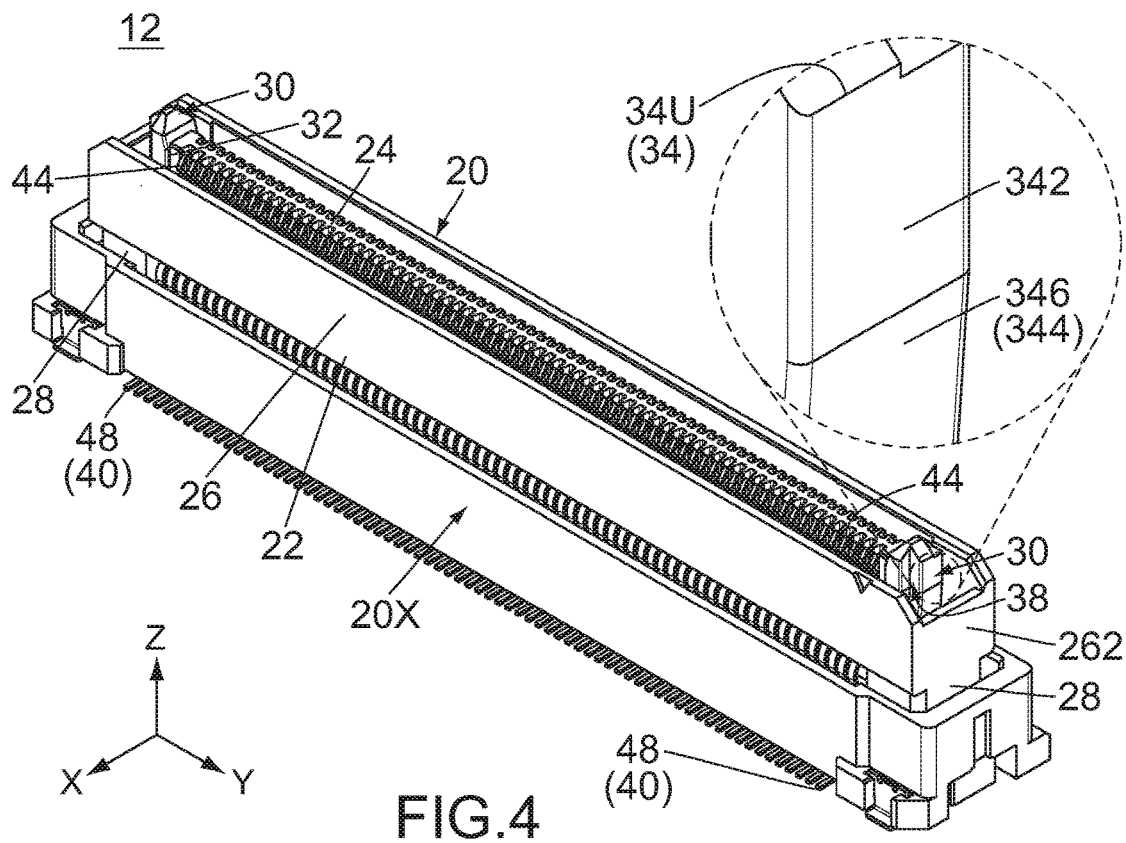
FIG. 4 is a perspective view showing the first connector of the connector assembly of FIG. 1, wherein a part of the first connector enclosed by dashed line is enlarged to be illustrated.
Figure 8:
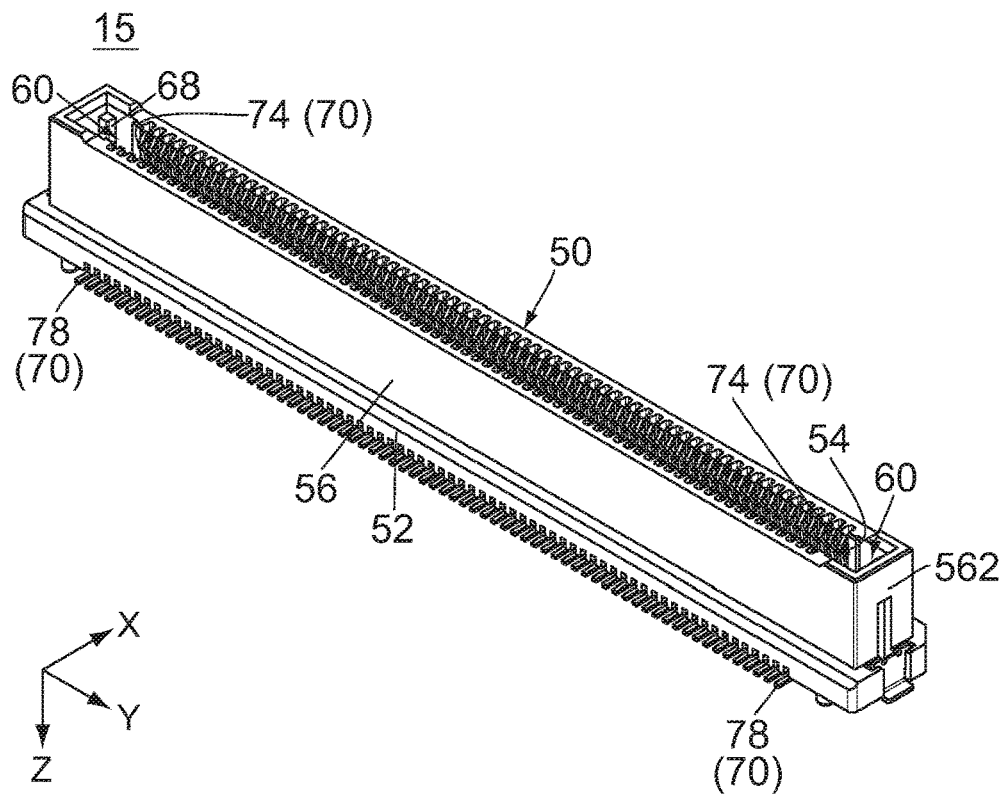
FIG. 8 is a perspective view showing the second connector of the connector assembly of FIG. 1.

Referring to FIGS. 4 and 8, in the present embodiment, each of the first positioning portions 30 is the projecting portion which is integrally formed with the first holding member 20, and each of the second positioning portions 60 is a recess which is formed in the second holding member 50. The first holding member 20 has the thus-formed first positioning portions 30, and the second holding member 50 has the thus-formed second positioning portions 60. However, the present invention is not limited thereto. For example, each of the first positioning portions 30 may be a recess while each of the second positioning portions 60 may be a projecting portion.

Hereafter, referring to FIGS. 6 and 10, further detailed explanation will be made about the first outer surfaces 34 of the first positioning portions 30 and the second inner surfaces 64 of the second positioning portions 60 in the present embodiment.

Referring to FIGS. 6 and 7, the first positioning portions 30 are provided with first depressions 344, respectively. In detail, the first outer surface 34 of each of the first positioning portions 30 has the first depression 344 in addition to the first outer plane 342. In other words, for each of the first positioning portions 30, each of the first outer plane 342 and the first depression 344 is formed on the first outer surface 34. Referring to FIGS. 13 and 14, each of the first positioning portions 30 has a structure that each of the first outer plane 342 and the first depression 344 is located below an upper end 34U of the first outer surface 34 under the mated state. Moreover, under the mated state, each of the first outer planes 342 extends in parallel to the Z-direction, and each of the first depressions 344 is depressed inward in the Y-direction. In contrast, under the mated state, the second inner surface 64 of each of the second positioning portions 60 extends in parallel to the Z-direction.

The middle wall 22 is formed with two trace holes 36 which correspond to the first depressions 344, respectively. Each of the trace holes 36 is a trace through which a metal mold is pulled out when the first depression 344 is formed and passes through the middle wall 22 in the Z-direction.

Figure 15:
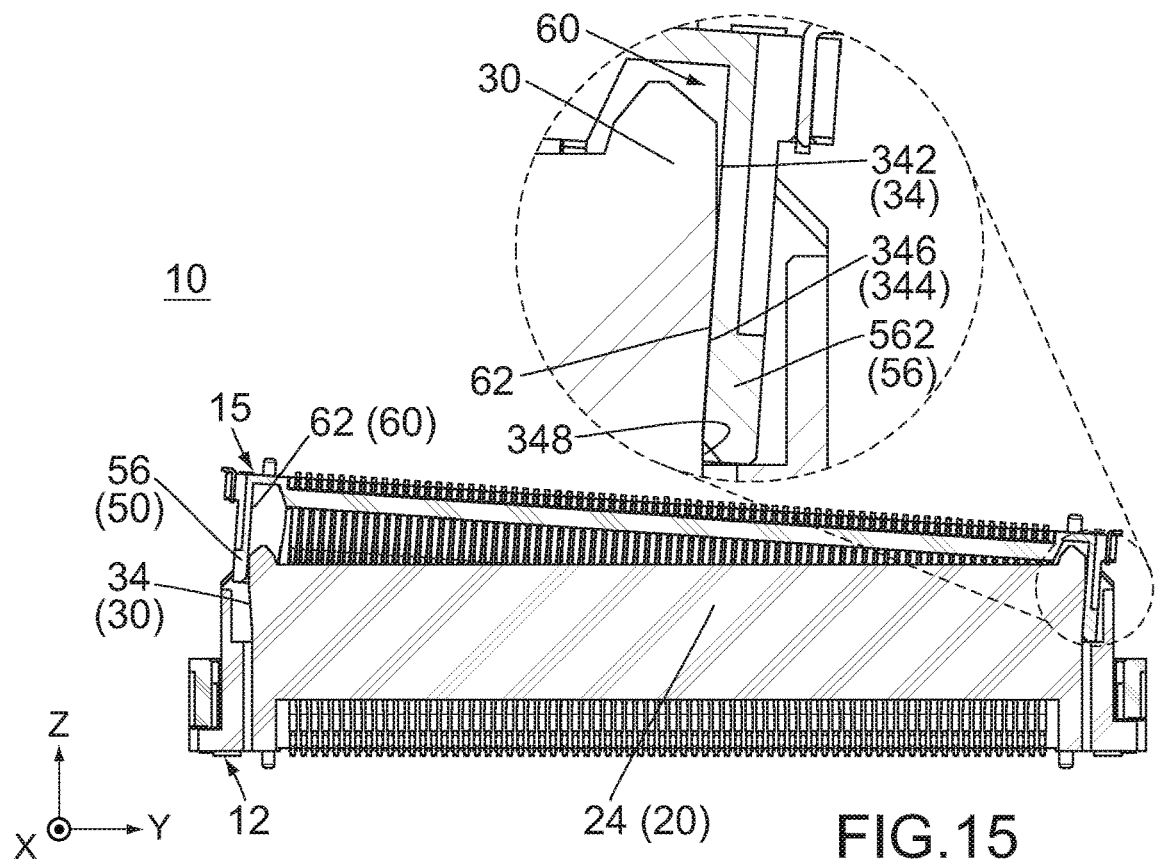
FIG. 15 is a cross-sectional view showing the connector assembly of FIG. 13, wherein the second connector is inclined relative to the first connector, and a part of the connector assembly enclosed by dashed line is enlarged to be illustrated.
Figure 16:
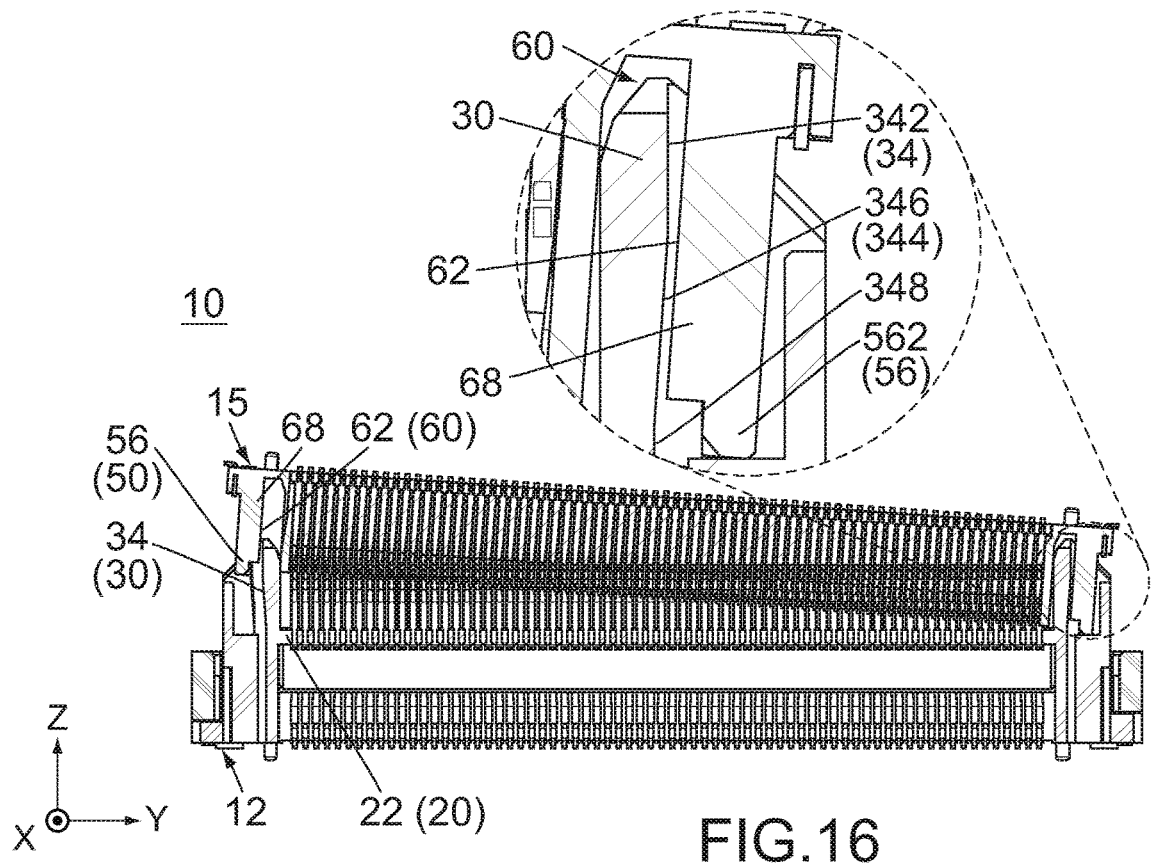
FIG. 16 is a cross-sectional view showing the connector assembly of FIG. 14, wherein the second connector is inclined relative to the first connector, and a part of the connector assembly enclosed by dashed line is enlarged to be illustrated.

Referring to FIGS. 15 and 16, the second connector 15 can be removed from the first connector 12 by applying an upward removal force to the second connector 15. The removal force is preferred to be applied in a well-balanced manner in the Y-direction. However, the removal force is often biased toward one of opposite sides of the second connector 15 in the Y-direction. For example, the removal force shown in FIGS. 15 and 16 is biased toward the negative Y-side of the second connector 15. When the removal force is biased as shown in FIGS. 15 and 16, the removal force generates an angular moment about the positive Y-side of the second connector 15, so that the second connector 15 is inclined relative to the first connector 12. Meanwhile, if the positive Y-side end wall 562 of the second peripheral wall 56 is strongly pressed against the first positioning portion 30, the second peripheral wall 56, particularly the positive Y-side end wall 562 thereof, might be damaged, for example.

According to the present embodiment, even if the second connector 15 is inclined relative to the first connector 12 during a removal process in which the second connector 15 is removed from the first connector 12, a remaining one of the second outer surfaces 62 of the second connector 15 is received in the first depression 344 of the corresponding first outer surface 34. For example, in FIGS. 15 and 16, the positive Y-side second outer surface 62 is received in the first depression 344 of the positive Y-side first outer surface 34. As a result, the second outer surfaces 62 are not applied with such excessive force that might damage the second peripheral wall 56. Thus, the present embodiment provides a structure which enables to reduce a damage that might be caused by an inclination of the second connector 15 during the removal process of the second connector 15 from the first connector 12.

Figure 17:
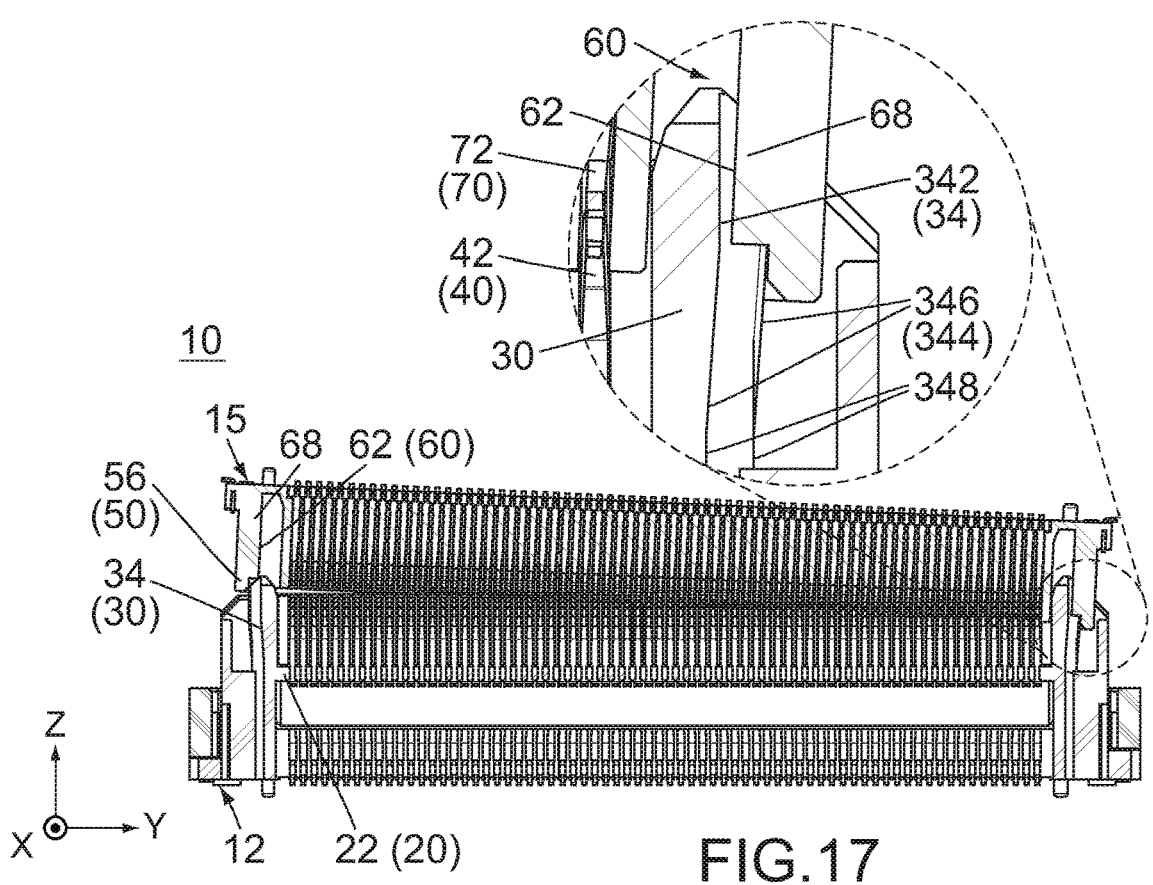
FIG. 17 is a cross-sectional view showing the connector assembly of FIG. 14, wherein the second connector is almost removed from the first connector, and a part of the connector assembly enclosed by dashed line is enlarged to be illustrated.

Referring to FIGS. 13 and 14, under the mated state, the upper ends 34U of the first outer surfaces 34 protrude outward in the Y-direction, so that a distance between the upper end 34U and the second outer surface 62 is shorter than another distance between a lower end of the first depression 344 and the second outer surface 62. Referring to FIG. 17, this structure can reduce a movement of the second connector 15 relative to the first connector 12 in the Y-direction during each of the removal process and the mating process so that the movement range of the second connector 15 becomes small. As a result, during each of the mating process and the removal process according to the present embodiment, the damage due to the inclination of the second connector 15 can be reduced while misalignment between each of the first terminals 40 and the corresponding second terminal 70 in the Y-direction (pitch direction) can be made slight.

Referring to FIGS. 6 and 7, in the present embodiment, each of the first depressions 344 has a first slope 346 and a first lower plane 348. Referring to FIGS. 13 and 14, under the mated state, each of the first slopes 346 extends downward while sloping inward in the Y-direction, and each of the first lower planes 348 extends downward in parallel to the Z-direction from a lower end of the first slope 346. However, the present invention is not limited thereto. For example, each of the first depressions 344 may have no first lower plane 348 but only the first slope 346. Moreover, each of the first depressions 344 may have a curved surface instead of the first slope 346, and the curved surface may extend downward while curving inward in the Y-direction.

According to the present embodiment, under the mated state, each of the first outer planes 342 extends downward in parallel to the Z-direction from the upper end 34U of the first outer surface 34, and each of the first depressions 344 is located below the first outer plane 342. In particular, each of the first outer planes 342 of the present embodiment is perpendicular to the Y-direction under the mated state. Since these first outer planes 342 are provided, abrasion of the upper ends 34U and thereabround can be reduced even in a case where the upper ends 34U are brought into abutment with the second connector 15 during each of the mating process and the removal process. However, the present invention is not limited thereto. For example, each of the first outer planes 342 may be oblique to the Y-direction to some extent under the mated state. In other words, each of the first outer planes 342 may be a plane intersecting with the Y-direction under the mated state. Moreover, each of the first outer surfaces 34 may have the first outer plane 342 as necessary. In other words, each of the first depressions 344 may extend from the upper end 34U of the first outer surface 34.

Referring to FIG. 14, according to the aforementioned embodiment, the first positioning portions 30 are provided with the first depressions 344, respectively. In contrast, each of the second positioning portions 60 is not provided with such depression. In detail, each of the first outer surfaces 34 has the first depression 344, while each of the first inner surfaces 32, the second outer surfaces 62 and the second inner surfaces 64 does not have such depression but is perpendicular to the Y-direction under the mated state. However, the present invention is not limited thereto. For example, each of the first inner surfaces 32, the second outer surfaces 62 and the second inner surfaces 64 may be oblique to the Y-direction to some extent under the mated state. Moreover, each of the second inner surfaces 64 may be provided with a depression as shown in the connector assembly 10A according to the modification described below.

Figure 27:
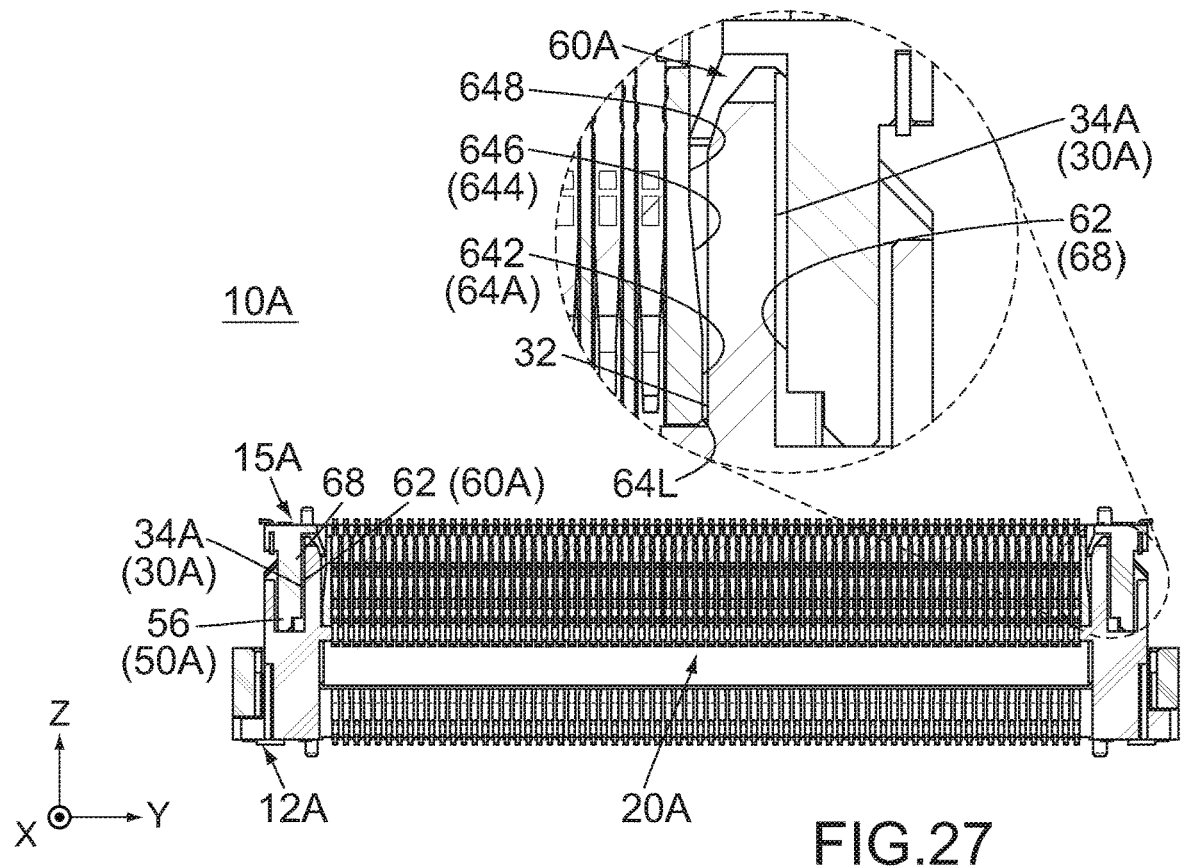
FIG. 27 is a cross-sectional view showing the connector assembly of FIG. 25, wherein the first connector and the second connector are mated with each other, and a part of the connector assembly enclosed by dashed line is enlarged to be illustrated.

Referring to FIG. 27, the connector assembly 10A according to the present modification comprises a first connector 12A and a second connector 15A. The second connector 15A is mateable with the first connector 12A, which is located below the second connector 15A in the Z-direction, along the Z-direction. The second connector 15A mated with the first connector 12A is removable from the first connector 12A along the Z-direction.

Figure 18:
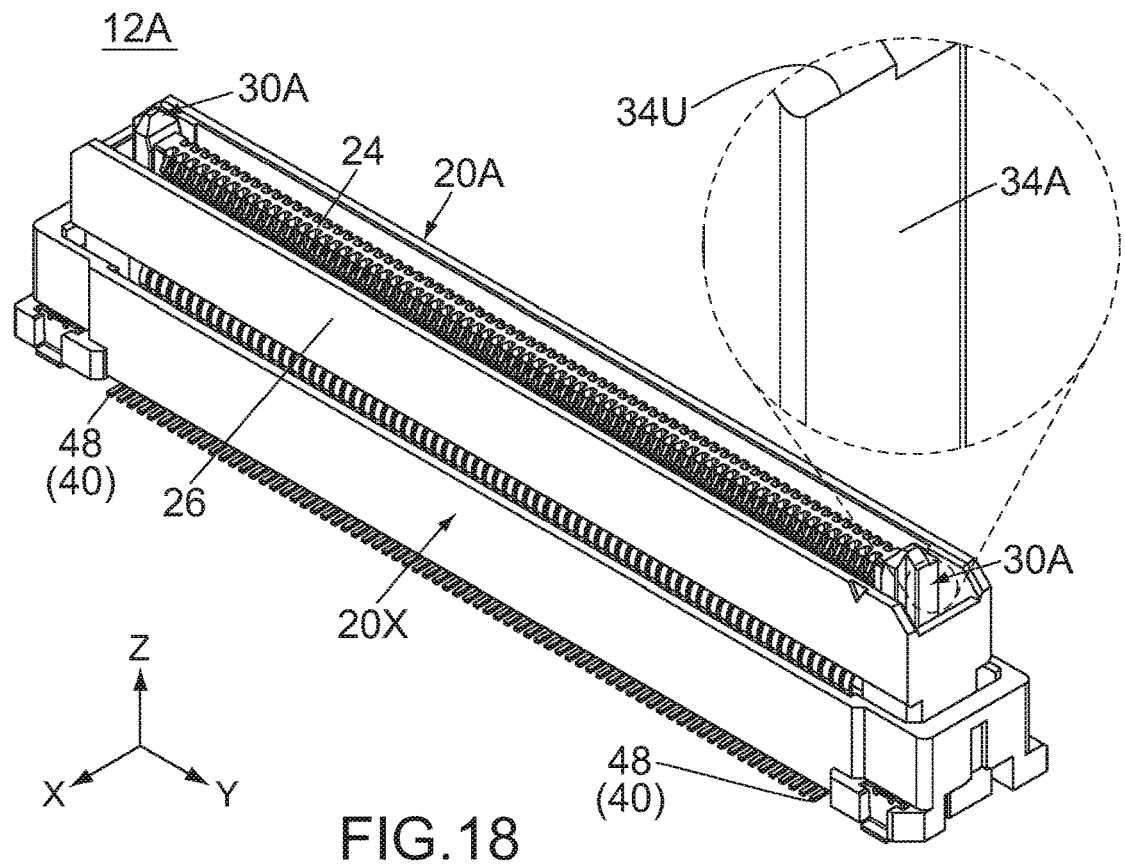
FIG. 18 is a perspective view showing a modification of the first connector of FIG. 4, wherein a part of the first connector enclosed by dashed line is enlarged to be illustrated.
Figure 19:
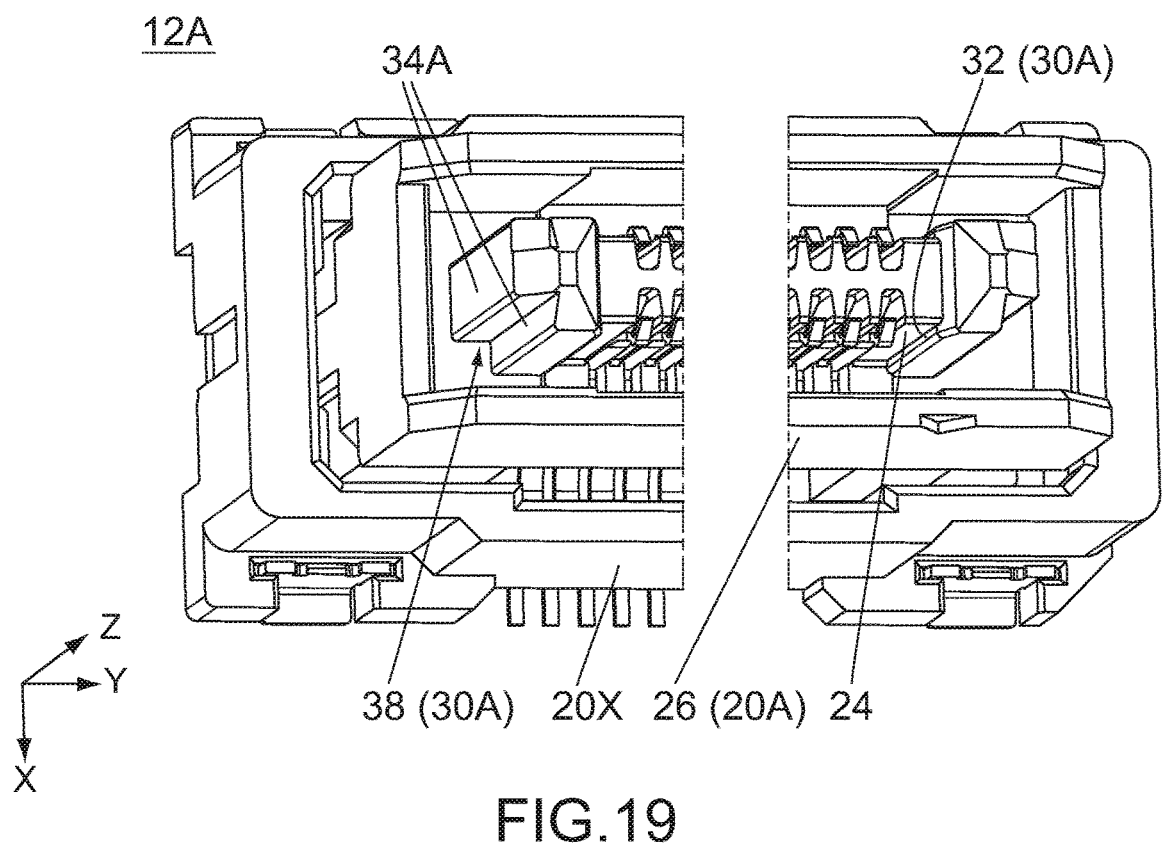
FIG. 19 is a perspective view showing opposite sides of the first connector of FIG. 18 in the horizontal direction.

Referring to FIGS. 18 and 19, the first connector 12A comprises the fixed housing 20X and a plurality of the first terminals 40 same as those of the first connector 12 (see FIG. 4) and comprises a first holding member (movable housing) 20A different from the first holding member 20 (see FIG. 4) of the first connector 12. The first holding member 20A has two first positioning portions 30A different from the first positioning portions 30 (see FIG. 4) of the first holding member 20. The first connector 12A is formed similarly to the first connector 12 except for the aforementioned differences.

Referring to FIG. 19, each of the first positioning portions 30A has a first outer surface 34A different from the first outer surface 34 (see FIG. 7). The first positioning portions 30A are formed similarly to the first positioning portions 30 (see FIG. 7) except for this difference. Each of the first outer surfaces 34A includes two surfaces which are apart from each other in the Y-direction similar to those of the first outer surface 34. However, each of the first outer surfaces 34A does not have the first depression 344 (see FIG. 7) but is a perpendicular plane perpendicular to the Y-direction unlike the first outer surface 34.

Figure 20:
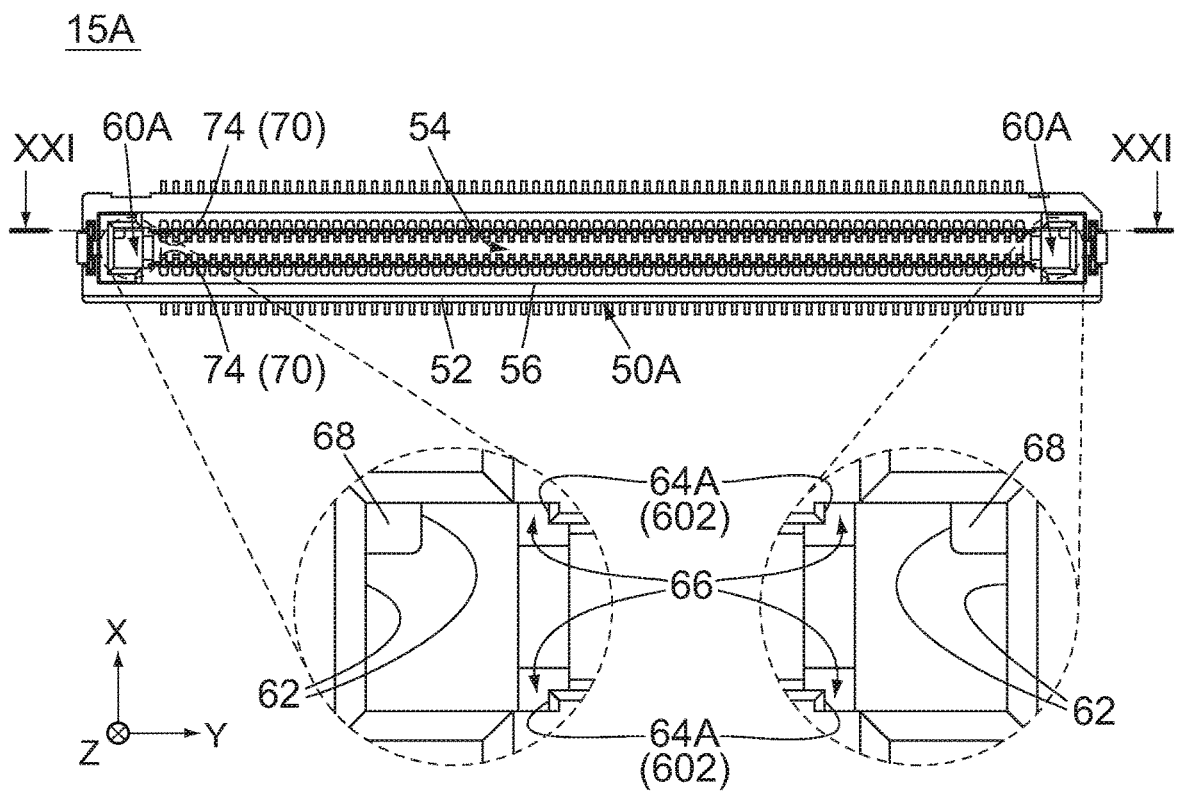
FIG. 20 is a plane view showing a modification of the second connector of FIG. 9, wherein parts of the second connector enclosed by dashed line are enlarged to be illustrated.
Figure 21:
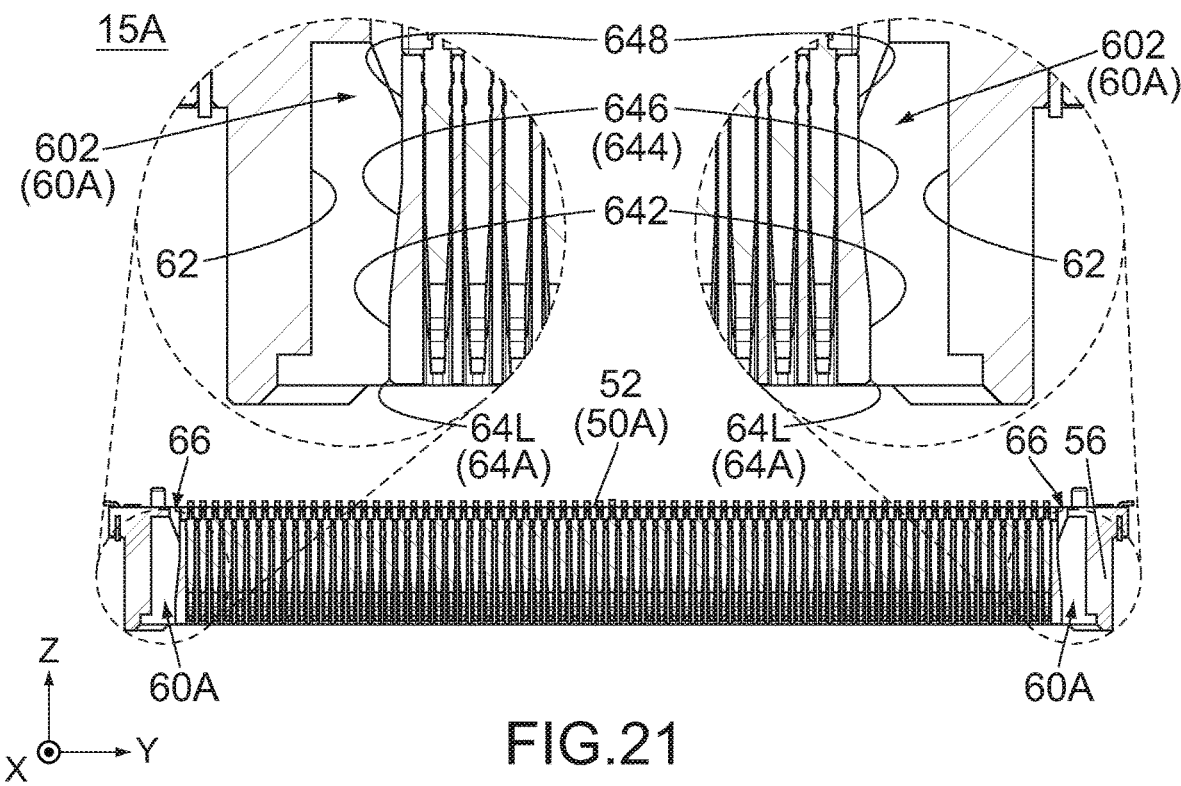
FIG. 21 is a cross-sectional view showing the second connector of FIG. 20, taken along line XXI-XXI, wherein parts of the second connector enclosed by dashed line are enlarged to be illustrated.
Figure 22:
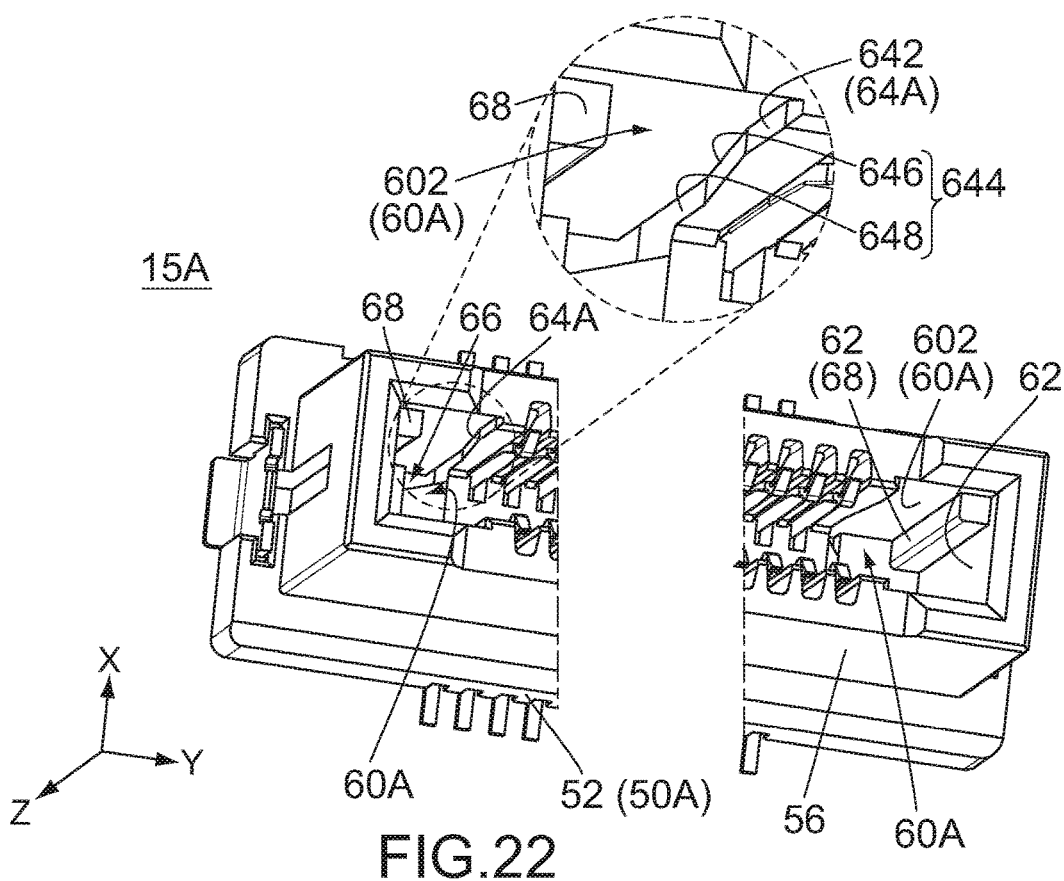
FIG. 22 is a perspective view showing opposite sides of the second connector of FIG. 20 in the horizontal direction, wherein a part of the second connector enclosed by dashed line is enlarged to be illustrated.

Referring to FIGS. 20 to 22, the second connector 15A comprises a plurality of the second terminals 70 same as those of the second connector 15 (see FIG. 9) and comprises a second holding member 50A different from the second holding member 50 (see FIG. 9) of the second connector 15. The second holding member 50A has two second positioning portions 60A different from the second positioning portions 60 (see FIG. 9) of the second holding member 50. The second connector 15A is formed similarly to the second connector 15 except for the aforementioned differences.

Referring to FIGS. 21 and 22, each of the second positioning portions 60A has a second inner surface 64A different from the second inner surface 64 (see FIG. 10). The second positioning portions 60A are formed similarly to the second positioning portions 60 (see FIG. 10) except for this difference. Each of the second positioning portions 60A has the two recessed portions 602 similar to those of the second positioning portions 60. For each of the second positioning portions 60A, the second inner surface 64A includes surfaces of the two recessed portions 602 which face outward in the Y-direction similarly to those of the second inner surface 64. However, each of the second inner surfaces 64A has a second inner plane 642 and a second depression 644 unlike the second inner surface 64. Thus, the second positioning portions 60A are provided with the second depressions 644, respectively.

Referring to FIG. 27, for each of the second positioning portions 60A of the connector assembly 10A, each of the second inner plane 642 and the second depression 644 is formed on the second inner surface 64A of the second connector 15A. Each of the second positioning portions 60A has a structure that each of the second inner plane 642 and the second depression 644 is located above a lower end 64L of the second inner surface 64A under a mated state where the first connector 12A and the second connector 15A are mated with each other. Moreover, under the mated state, each of the second inner planes 642 extends in parallel to the Z-direction, and each of the second depressions 644 is depressed inward in the Y-direction. In contrast, under the mated state, each of the first inner surfaces 32 of the first positioning portions 30A extends in parallel to the Z-direction.

Referring to FIGS. 20 to 22, the base portion 52 of the second connector 15A is formed with two trace holes 66 which correspond to the second depressions 644, respectively. Each of the trace holes 66 is a trace through which a metal mold is pulled out when the second depression 644 is formed and passes through the base portion 52 in the Z-direction.

Figure 23:
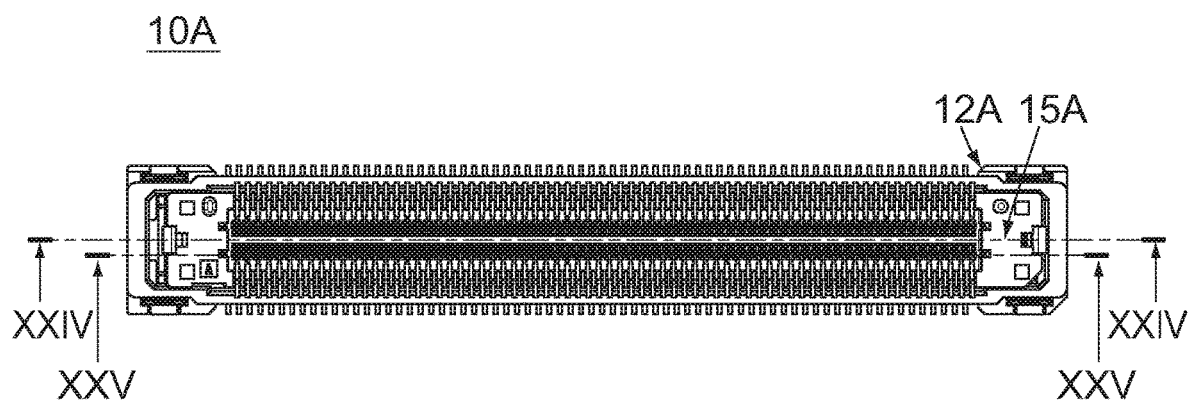
FIG. 23 is a plane view showing a connector assembly comprising the first connector of FIG. 18 and the second connector of FIG. 20, wherein the second connector is inclined relative to the first connector.
Figure 24:
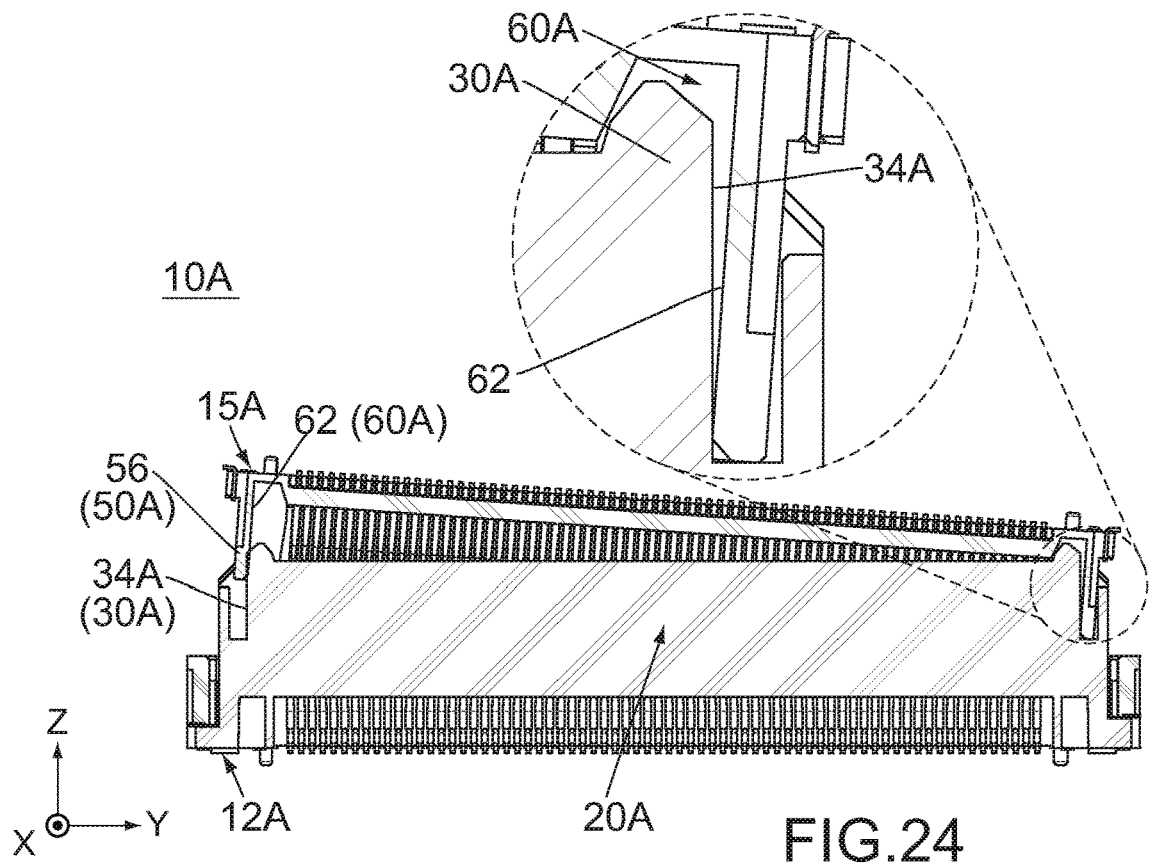
FIG. 24 is a cross-sectional view showing the connector assembly of FIG. 23, taken along line XXIV-XXIV, wherein a part of the connector assembly enclosed by dashed line is enlarged to be illustrated.
Figure 25:
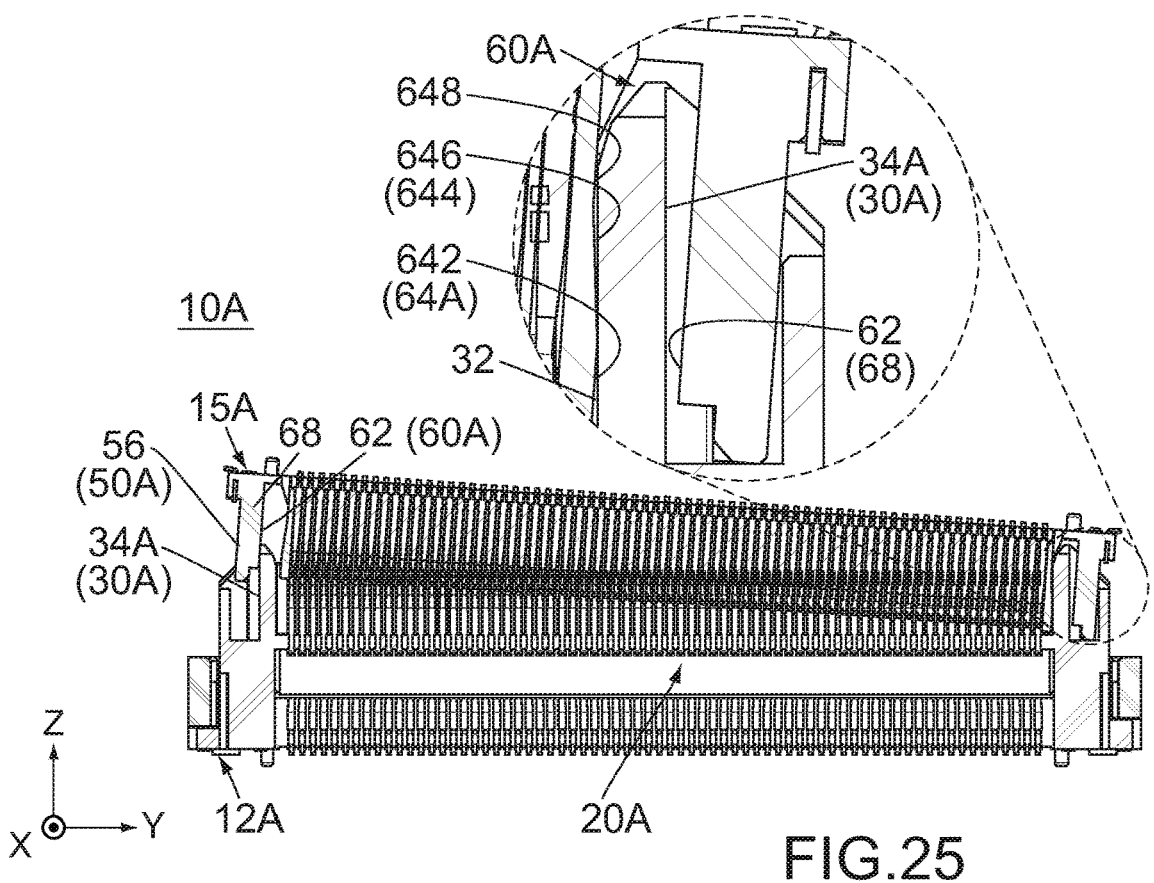
FIG. 25 is a cross-sectional view showing the connector assembly of FIG. 23, taken along line XXV-XXV, wherein a part of the connector assembly enclosed by dashed line is enlarged to be illustrated.
Figure 26:
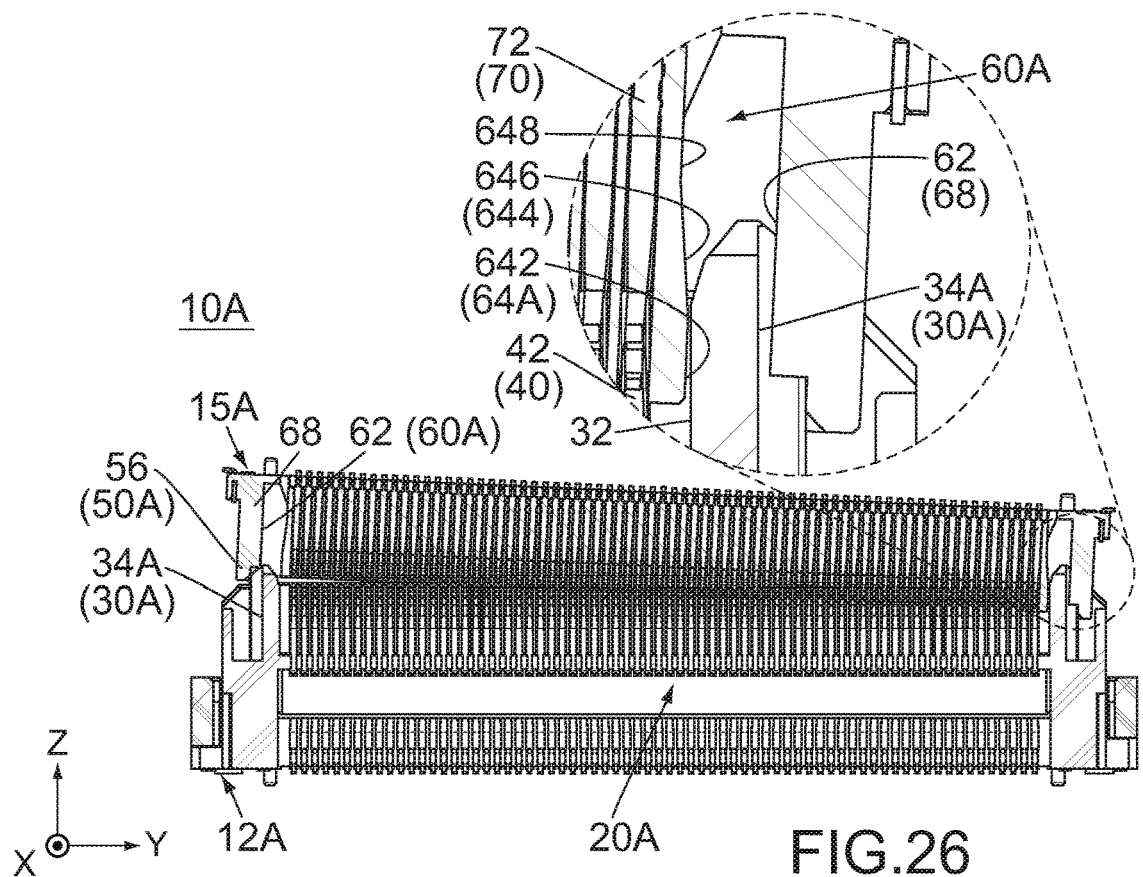
FIG. 26 is a cross-sectional view showing the connector assembly of FIG. 25, wherein the second connector is almost removed from the first connector, and a part of the connector assembly enclosed by dashed line is enlarged to be illustrated.

Referring to FIGS. 23 to 25, the second connector 15A of the present modification is inclined relative to the first connector 12A when a removal force is biased in the Y-direction during a removal process in which the second connector 15A is removed from the first connector 12A. For example, the removal force shown in FIGS. 24 and 25 is biased toward the negative Y-side of the second connector 15A.

Comparing FIG. 24 with FIG. 15, when the second connector 15A is inclined relative to the first connector 12A as illustrated, a lower end of the positive Y-side second outer surface 62 of the second connector 15A is brought into abutment with the first outer surface 34A of the first connector 12A, and the second connector 15A is slightly moved in the positive Y-direction. Referring to FIG. 25, meanwhile, the positive Y-side first inner surface 32 of the first connector 12A is received in the second depression 644 of the positive Y-side second inner surface 64A of the second connector 15A. As a result, the second inner surfaces 64A are not applied with such excessive force that might damage the second inner surfaces 64A. Thus, the present modification provides a structure which enables to reduce a damage that might be caused by an inclination of the second connector 15A during the removal process of the second connector 15A from the first connector 12A.

Referring to FIG. 27, under the mated state, the lower ends 64L of the second inner surfaces 64A protrude outward in the Y-direction, and a distance between the lower end 64L and the first inner surface 32 is shorter than another distance between an upper end of the second depression 644 and the first inner surface 32. This structure can reduce a movement of the second connector 15A relative to the first connector 12A in the Y-direction during each of the removal process and the mating process so that the movement range of the second connector 15A becomes small. As a result, during each of the mating process and the removal process according to the present modification, the damage due to the inclination of the second connector 15A can be reduced while misalignment between each of the first terminals 40 and the corresponding second terminal 70 in the Y-direction (pitch direction) can be made slight.

Referring to FIGS. 21 and 22, in the present modification, each of the second depressions 644 has a second slope 646 and a second upper plane 648. Referring to FIG. 27, under the mated state, each of the second slopes 646 extends upward while sloping inward in the Y-direction, and each of the second upper planes 648 extends upward in parallel to the Z-direction from an upper end of the second slope 646. However, the present invention is not limited thereto. For example, each of the second depressions 644 may have no second upper plane 648 but only the second slope 646. Moreover, each of the second depressions 644 may have a curved surface instead of the second slope 646, and the curved surface may extend upward while curving inward in the Y-direction.

According to the present modification, under the mated state, each of the second inner planes 642 extends upward in parallel to the Z-direction from the lower end 64L of the second inner surface 64A, and each of the second depressions 644 is located above the second inner plane 642. In particular, each of the second inner planes 642 of the present modification is perpendicular to the Y-direction under the mated state. Since these second inner planes 642 are provided, abrasion of the lower ends 64L and therearound can be reduced during each of the mating process and the removal process. However, the present invention is not limited thereto. For example, each of the second inner planes 642 may be a plane intersecting with the Y-direction under the mated state. Moreover, each of the second inner surfaces 64A may have the second inner plane 642 as necessary. In other words, each of the second depressions 644 may extend from the lower end 64L of the second inner surface 64A.

Referring to FIG. 14, each of the second positioning portions 60 of the connector assembly 10 is provided with none of the second depressions, and each of the second inner surfaces 64 extends in parallel to the Z-direction under the mated state. Referring to FIG. 27, the second positioning portions 60A of the connector assembly 10A are provided with the second depressions 644, respectively. In contrast, each of the first positioning portions 30A is provided with none of the first depressions, and each of the first outer surfaces 34A extends in parallel to the Z-direction under the mated state.

Figure 28:
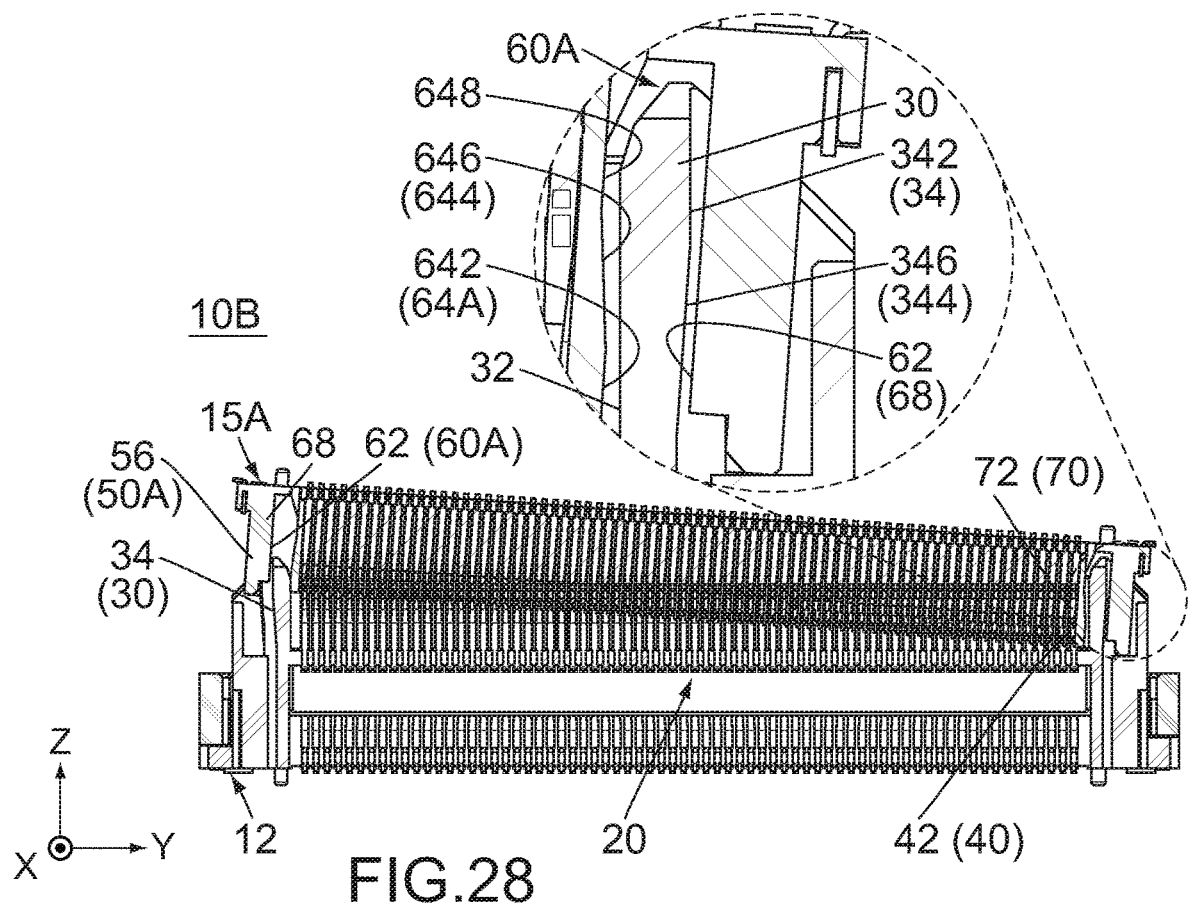
FIG. 28 is a cross-sectional view showing a modification of the connector assembly of FIG. 25, wherein a part of the connector assembly enclosed by dashed line is enlarged to be illustrated.
Figure 29:
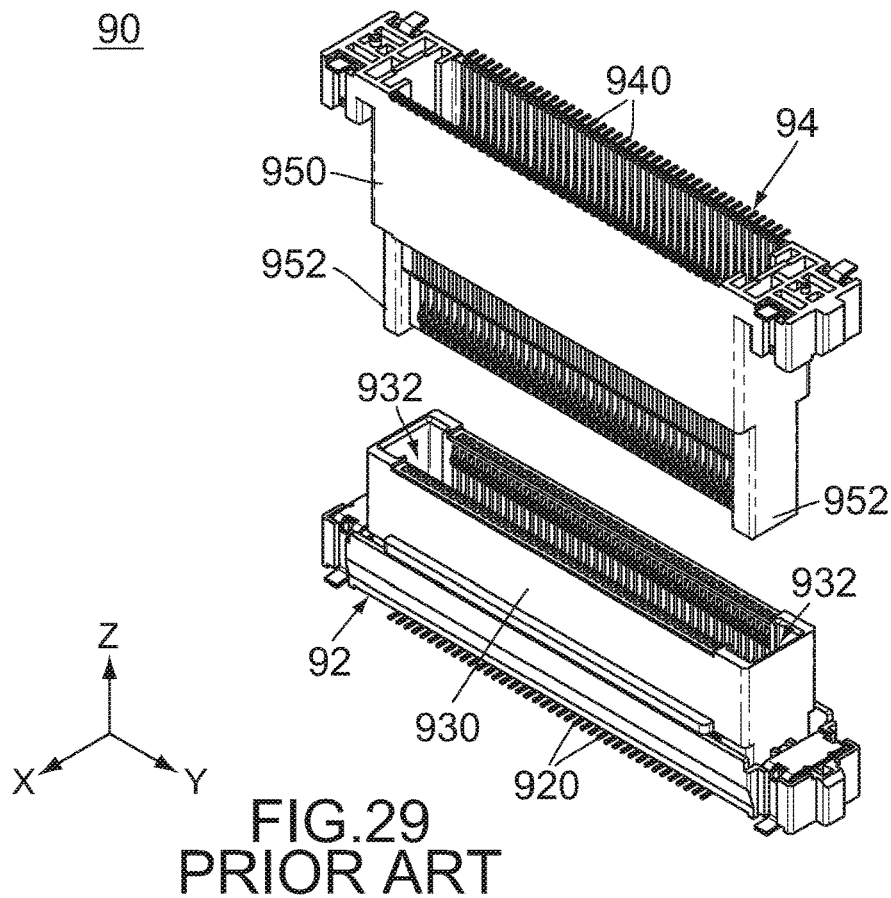
FIG. 29 is a perspective view showing a connector assembly of Patent Document 1, wherein a receptacle and a plug of the connector assembly are apart from each other.
Figure 30:
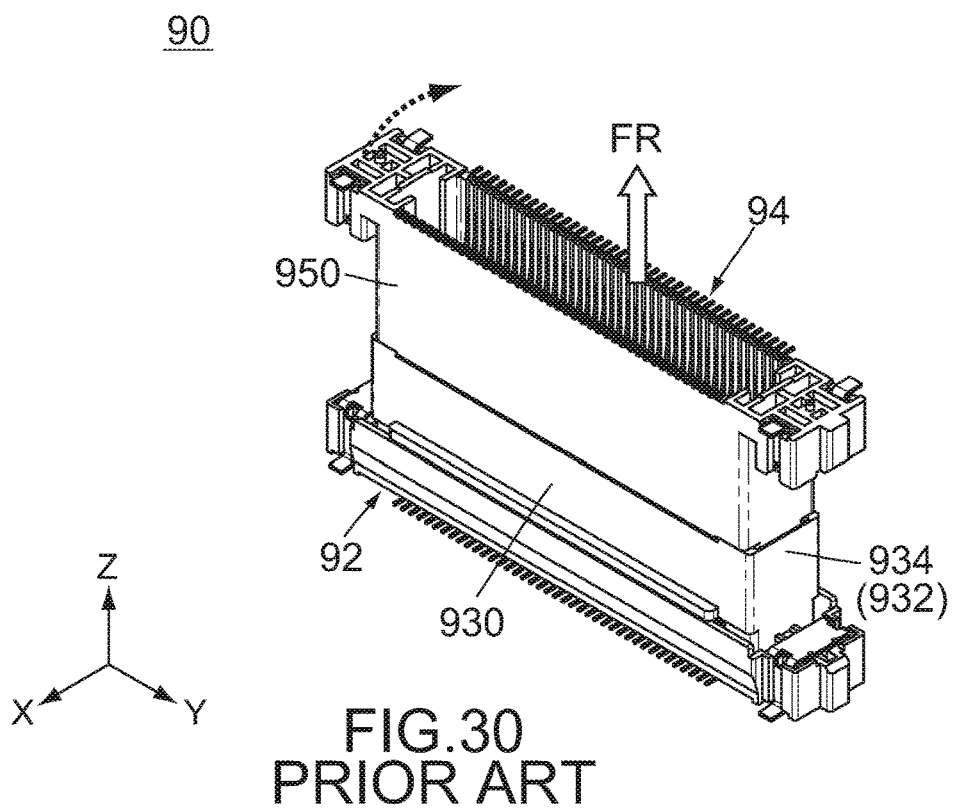
FIG. 30 is a perspective view showing the connector assembly of FIG. 29, wherein the receptacle and the plug are mated with each other.

The aforementioned embodiment and the modification can be variously combined. For example, referring to FIG. 28, the connector assembly 10B according to another modification comprises the first connector 12 and the second connector 15A. The second connector 15A is mateable with the first connector 12 along the Z-direction and is removable from the first connector 12 along the Z-direction. In the connector assembly 10B, the first positioning portions 30 are provided with the first depressions 344, respectively, and the second positioning portions 60A are provided with the second depressions 644, respectively.

The connector assembly 10B of the present modification is preferable from a view point of reduction of the damage due to the inclination of the second connector. However, according to the connector assembly 10B, the second connector 15A is relatively easy to be moved relative to the first connector 12 in the Y-direction during each of the mating process and the removal process, particularly when the second connector 15A is inclined relative to the first connector 12. Therefore, the connector assembly 10 (see FIG. 14) and the connector assembly 10A (see FIG. 27) are preferable from another view point of reduction of misalignment between each of the first terminals 40 and the corresponding second terminal 70 in the Y-direction (pitch direction).

As described above, the connector assembly according to the present invention comprises at least one of a pair of the first depressions provided on the first positioning portions 30, respectively, and another pair of the second depressions provided on the second positioning portions, respectively. When the first positioning portions 30 are provided with the first depressions, respectively, each of the first depressions is formed on the first outer surface of the first positioning portion 30. When the second positioning portions are provided with the second depressions, respectively, each of the second depressions is formed on the second inner surface of the second positioning portion. When a connector comprises the two first positioning portions 30 provided with the first depressions, respectively, the connector can be used as the first connector of the present invention. Similarly, when another connector comprises the two second positioning portions provided with the second depressions, respectively, the connector can be used as the second connector of the present invention.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector assembly comprising a first connector and a second connector, wherein:

the second connector is mateable with the first connector which is located below the second connector in an upper-lower direction;

the first connector comprises two first positioning portions;

the first positioning portions are apart from each other in a horizontal direction perpendicular to the upper-lower direction;

each of the first positioning portions projects upward and has a first inner surface facing inward in the horizontal direction and a first outer surface facing outward in the horizontal direction;

the second connector comprises two second positioning portions which correspond to the first positioning portions, respectively;

the second positioning portions are apart from each other in the horizontal direction;

each of the second positioning portions is recessed upward and has a second inner surface facing outward in the horizontal direction and a second outer surface facing inward in the horizontal direction;

while the first connector and the second connector are mated with each other, the second positioning portions receive the first positioning portions, respectively, and the second connector is positioned to the first connector in the horizontal direction;

under a mated state where the first connector and the second connector are mated with each other, each of the first inner surfaces faces a corresponding one of the second inner surfaces in the horizontal direction, and each of the first outer surfaces faces a corresponding one of the second outer surfaces in the horizontal direction;

the connector assembly comprises at least one of a pair of first depressions provided to the first positioning portions, respectively, and another pair of second depressions provided to the second positioning portions, respectively;

when the first positioning portions are provided with the first depressions, respectively, each of the first depressions is formed on the first outer surface and, under the mated state, located below an upper end of the first outer surface and depressed inward in the horizontal direction; and when the second positioning portions are provided with the second depressions, respectively, each of the second depressions is formed on the second inner surface and, under the mated state, located above a lower end of the second inner surface and depressed inward in the horizontal direction.

2. The connector assembly as recited in claim 1, wherein:
the first positioning portions are provided with the first depressions, respectively;
each of the first outer surfaces has a first outer plane; and
under the mated state, each of the first outer planes extends downward in parallel to the upper-lower direction from the upper end of the first outer surface, and each of the first depressions is located below the first outer plane.

3. The connector assembly as recited in claim 1, wherein:
the first positioning portions are provided with the first depressions, respectively;
each of the first depressions has a first slope; and
under the mated state, each of the first slopes extends downward while sloping inward in the horizontal direction.

4. The connector assembly as recited in claim 1, wherein:
the second positioning portions are provided with the second depressions, respectively;
each of the second inner surfaces has a second inner plane; and
under the mated state, each of the second inner planes extends upward in parallel to the upper-lower direction from the lower end of the second inner surface, and each of the second depressions is located above the second inner plane.

5. The connector assembly as recited in claim 1, wherein:
the second positioning portions are provided with the second depressions, respectively;
each of the second depressions has a second slope; and
under the mated state, each of the second slopes extends upward while sloping inward in the horizontal direction.

6. The connector assembly as recited in claim 1, wherein:
the first connector comprises a first holding member and a plurality of first terminals;
the first terminals are held by the first holding member and arranged in the horizontal direction;
the first holding member has the first positioning portions;
the second connector comprises a second holding member and a plurality of second terminals;
the second terminals are held by the second holding member and arranged in the horizontal direction; and the second holding member has the second positioning portions.

7. The connector assembly as recited in claim 6, wherein:
the first holding member has an island-like portion and a first peripheral wall;
the first positioning portions are located at opposite sides of the island-like portion in the horizontal direction, respectively; and
in a horizontal plane perpendicular to the upper-lower direction, the first peripheral wall is apart from the island-like portion and the first positioning portions and encloses the island-like portion and the first positioning portions.

8. The connector assembly as recited in claim 7, wherein each of the first positioning portions has a protruding portion which protrudes beyond the island-like portion in a front-rear direction perpendicular to both the upper-lower direction and the horizontal direction.

9. The connector assembly as recited in claim 8, wherein:
the second holding member has a receiving portion and a second peripheral wall;
the second peripheral wall encloses the receiving portion in the horizontal plane;
the second positioning portions are located at opposite sides of the second peripheral wall in the horizontal direction, respectively;
each of the second positioning portions has a recessed portion which is recessed outward in the front-rear direction; and
under the mated state, the receiving portion receives the island-like portion, and the recessed portions receive the protruding portions, respectively.

10. The connector assembly as recited in claim 1, wherein:
the first positioning portions are provided with the first depressions, respectively, while each of the second positioning portions is provided with none of the second depressions; and
under the mated state, each of the second inner surfaces extends in parallel to the upper-lower direction.

11. The connector assembly as recited in claim 1, wherein:
the second positioning portions are provided with the second depressions, respectively, while each of the first positioning portions is provided with none of the first depressions; and
under the mated state, each of the first outer surfaces extends in parallel to the upper-lower direction.

12. A connector designed to be used as the first connector of the connector assembly as recited in claim 1, wherein the connector comprises the two first positioning portions provided with the first depressions, respectively.

13. A connector designed to be used as the second connector of the connector assembly as recited in claim 1, wherein the connector comprises the two second positioning portions provided with the second depressions, respectively.

* * * * *